US008736321B2

(12) United States Patent
Nishiyama et al.

(10) Patent No.: US 8,736,321 B2
(45) Date of Patent: May 27, 2014

(54) TRANSMISSION/RECEPTION DEVICE AND INFORMATION PROCESSING DEVICE

(71) Applicant: Fujitsu Limited, Kawasaki (JP)

(72) Inventors: Ryuichi Nishiyama, Yokohama (JP); Jun Yamada, Kawasaki (JP); Naoya Shibayama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/866,061

(22) Filed: Apr. 19, 2013

(65) Prior Publication Data

US 2013/0229211 A1 Sep. 5, 2013

Related U.S. Application Data

(63) Continuation of application No. PCT/JP2010/069741, filed on Nov. 5, 2010.

(51) Int. Cl.
H03L 7/06 (2006.01)
(52) U.S. Cl.
USPC ............ 327/146; 327/149; 327/158; 327/161
(58) Field of Classification Search
USPC .............. 327/141, 144–163; 331/1/A, 15–17; 375/373–376
See application file for complete search history.

(56) References Cited

U.S. PATENT DOCUMENTS

| 6,675,117 | B2 | 1/2004 | Adam et al. | |
|---|---|---|---|---|
| 8,138,799 | B2* | 3/2012 | Hayashi | 327/3 |
| 8,286,022 | B2* | 10/2012 | Fung et al. | 713/401 |
| 8,422,590 | B2* | 4/2013 | Leibowitz et al. | 375/316 |
| 8,429,439 | B2* | 4/2013 | Asmanis et al. | 713/503 |
| 2002/0191719 | A1 | 12/2002 | Hasako et al. | |
| 2006/0244505 | A1* | 11/2006 | Fung et al. | 327/293 |
| 2009/0121761 | A1* | 5/2009 | Fung et al. | 327/161 |
| 2010/0295591 | A1* | 11/2010 | Asmanis et al. | 327/276 |

FOREIGN PATENT DOCUMENTS

| JP | 11-26593 A | 1/1999 |
|---|---|---|
| JP | 2002-374312 A | 12/2002 |
| JP | 2004-515788 | 5/2004 |
| JP | 2005-268844 | 9/2005 |
| JP | 2007-295021 | 11/2007 |
| WO | WO 02/48727 A2 | 6/2002 |

OTHER PUBLICATIONS

International Search Report, mailed in connection with PCT/JP2010/069741 and mailed Nov. 30, 2010.
Japanese Office Action mailed Nov. 19, 2013 for corresponding Japanese Application No. 2012-541700, with Partial English-language Translation.

* cited by examiner

Primary Examiner — Brandon S Cole
(74) Attorney, Agent, or Firm — Fujitsu Patent Center

(57) ABSTRACT

A transmission/reception device includes a transmission circuit configured to apply a delay to at least one of a positive signal and a negative signal of differential signals to be sent to another device, detect a direction of a differential signal skew between the positive signal and the negative signal, to at least one of which the delay is applied, and control the delay in a manner as to reduce the differential signal skew; and a reception circuit configured to apply a delay to at least one of a positive signal and a negative signal of differential signals sent from another transmission/reception device, detect a direction of a differential signal skew between the positive signal and the negative signal, to at least one of which the delay is applied, and control the delay in a manner as to reduce the differential signal skew.

11 Claims, 24 Drawing Sheets

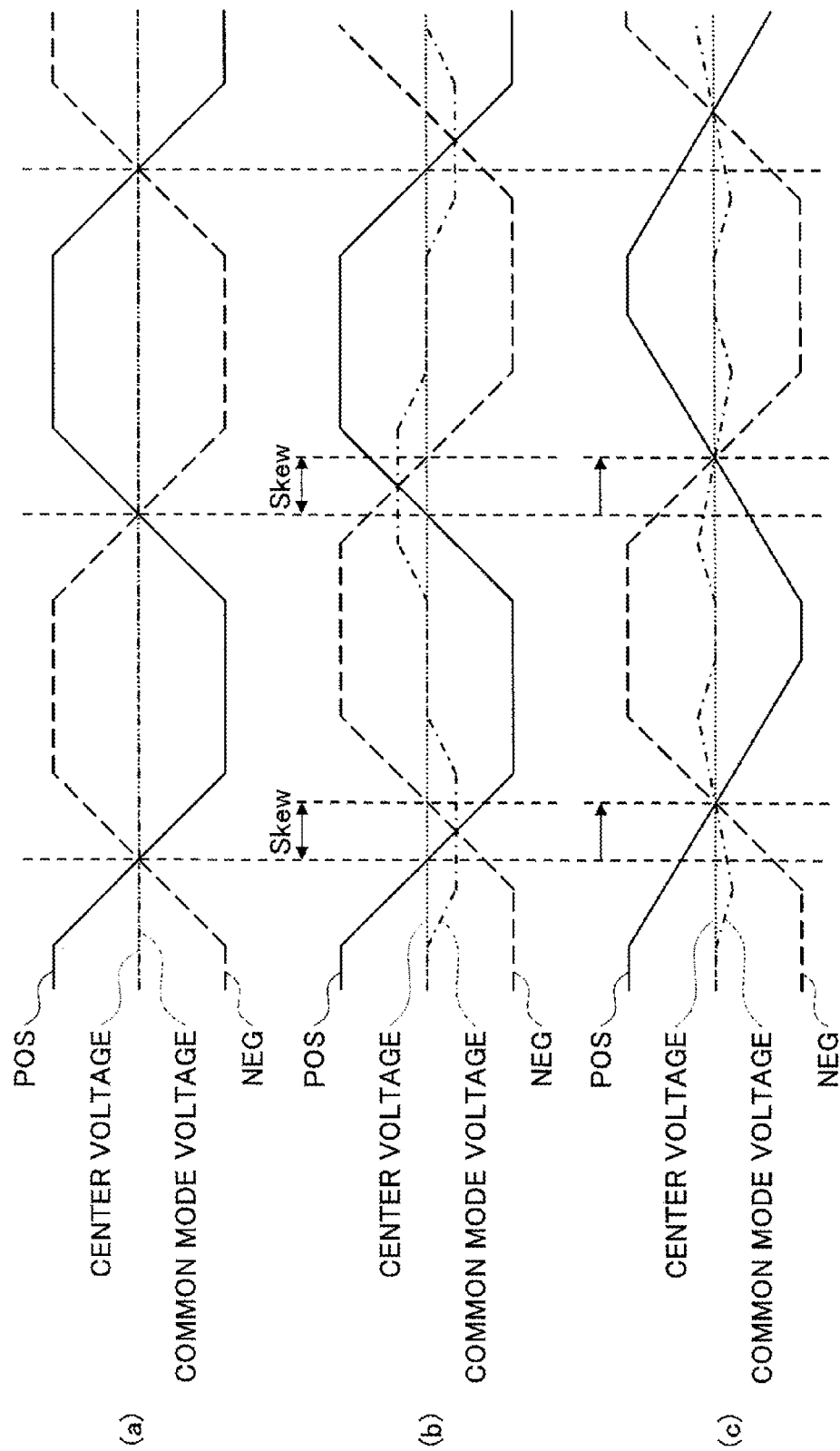

TRANSMISSION/RECEPTION DEVICE AND INFORMATION PROCESSING DEVICE

CROSS-REFERENCE TO RELATED APPLICATION

This patent application is based upon and claims the benefit of priority under 35 USC 120 and 365(c) of PCT application JP2010/069741 filed in Japan on Nov. 5, 2010, the entire contents of which are incorporated herein by reference.

FIELD

The present invention is related to a transmission/reception device and an information processing device. For example, the present invention is particularly related to a transmission/reception device and an information processing device for performing transmission/reception of differential signals.

BACKGROUND

There is proposed a reception device and a reception method for reducing the phase difference between a positive signal and a negative signal of differential signals, and automatically and optimally adjusting the phase difference between a positive signal and a negative signal.

Furthermore, there is proposed a differential circuit for adjusting the delay difference between two signals transmitted by a differential method to be within a predetermined range, and mitigating the decrease in the amplitude of the differential signals.

Furthermore, there is proposed an automatic test system having the following configuration. First and second driver circuits respectively generate edges. The edges return by being reflected by a mismatch load of the tested device. The time interval between the edge and the reflection is measured. Variable delay circuits that are provided in series to the driver circuits are adjusted so that the signals from the first and second driver circuits reach the tested device substantially at the same time according to the measured time interval.

Patent Document 1: Japanese Laid-Open Patent Publication No. 2007-295021
Patent Document 2: Japanese Laid-Open Patent Publication No. 2005-268844
Patent Document 3: U.S. Pat. No. 6,675,117

SUMMARY

According to an embodiment of the present invention, a transmission/reception device includes a transmission circuit configured to send differential signals to another transmission/reception device; and a reception circuit configured to receive the differential signals from the another transmission/reception device, wherein the transmission circuit includes a first delay application unit configured to apply a delay to at least one of a positive signal and a negative signal of the differential signals sent to the another transmission/reception device, a first skew detection unit configured to detect a differential signal skew between the positive signal and the negative signal, to at least one of which the delay is applied by the first delay application unit, and a first control unit configured to control the first delay application unit in a manner as to reduce the differential signal skew detected by the first skew detection unit, and the reception circuit includes a second delay application unit configured to apply a delay to at least one of a positive signal and a negative signal of differential signals sent from the another transmission/reception device, a second skew detection unit configured to detect a differential signal skew between the positive signal and the negative signal received from the transmission circuit, to at least one of which the delay is applied by the second delay application unit, and a second control unit configured to control the second delay application unit in a manner as to reduce the differential signal skew detected by the second skew detection unit.

The object and advantages of the invention will be realized and attained by means of the elements and combinations particularly pointed out in the appended claims. It is to be understood that both the foregoing general description and the following detailed description are exemplary and explanatory and are not restrictive of the invention as claimed.

BRIEF DESCRIPTION OF DRAWINGS

FIG. 24 is a waveform diagram for describing an example of a differential signal skew correction operation at the receiving side according to the configuration example illustrated in FIG. 23.

DESCRIPTION OF EMBODIMENTS

A transmission/reception device according to an embodiment of the present invention is for performing transmission/reception of differential signals through a transmission line. The differential signal skew is detected by both the sending side and the receiving side, and the sending side and the receiving side both have a function of separately correcting the differential signal skew.

Figure 1:
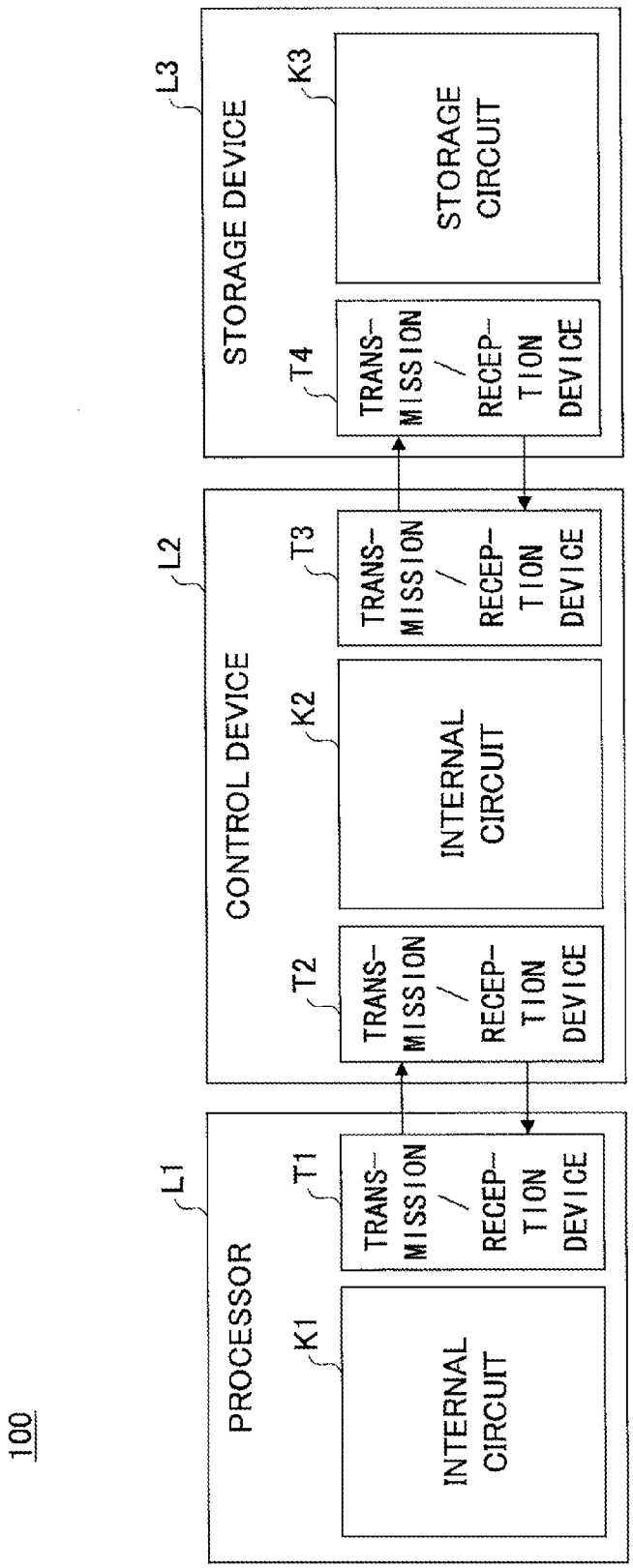
FIG. 1 is a block diagram of an example of a configuration of an information processing device according to an embodiment of the present invention.

FIG. 1 illustrates an example of a configuration of an information processing device according to an embodiment of the present invention. For example, the information processing device is used as a server and a personal computer, etc. An information processing device 100 illustrated in FIG. 1 includes a processor (processing device) L1, a control device L2, and a storage device L3. In the example of FIG. 1, the processor L1 is an LSI (Large Scale Integrated circuit, semiconductor integrated circuit, the same applies hereinafter) for performing operations such as arithmetic operations, logical operations, and comparisons. In the example of FIG. 1, the storage device L3 stores data to be used in operations by the processor L1, and is an LSI for storing data after operations. In the example of FIG. 1, the control device L2 is an LSI for controlling the respective operations of the processor L1 and the storage device L3.

The devices (LSIs) L1, L2, and L3 respectively include internal circuits K1, K2, and a storage circuit K3 for realizing the respective functions, and additionally include transmission/reception devices T1, T2, T3, and T4. The internal circuit K2 of the control device L2 similarly performs transmission/reception of data with the internal circuit K1 of the processor L1 via the transmission/reception device T2 and the transmission/reception device T1 of the processor L1. The internal circuit K2 of the control device L2 performs transmission/reception of data with the storage circuit K3 of the storage device L3 via the transmission/reception device T3 and the transmission/reception device T4 of the storage device L3. In other words, the transmission/reception devices T2, T1 perform transmission/reception of data between the control device L2 and the processor L1, and the transmission/reception devices T3, T4 perform transmission/reception of data between the control device L2 and the storage device L3.

In the information processing device 100, there is demand to increase the speed of a bus connecting the respective LSIs L1, L2, L3 according to the increase in the information amount to be processed and demand to increase the processing speed. Therefore, the transmission/reception devices T1 through T4 for performing transmission/reception among the LSIs have a function of a high-speed serial link using a differential transmission method.

The differential transmission method is advantageous in terms of increasing the speed of signal transmission, but a differential signal skew that occurs between a positive signal and a negative signal of the differential signals being used may cause factors of deterioration in the transmission quality and an increase of common mode noise, etc.

Figure 2:
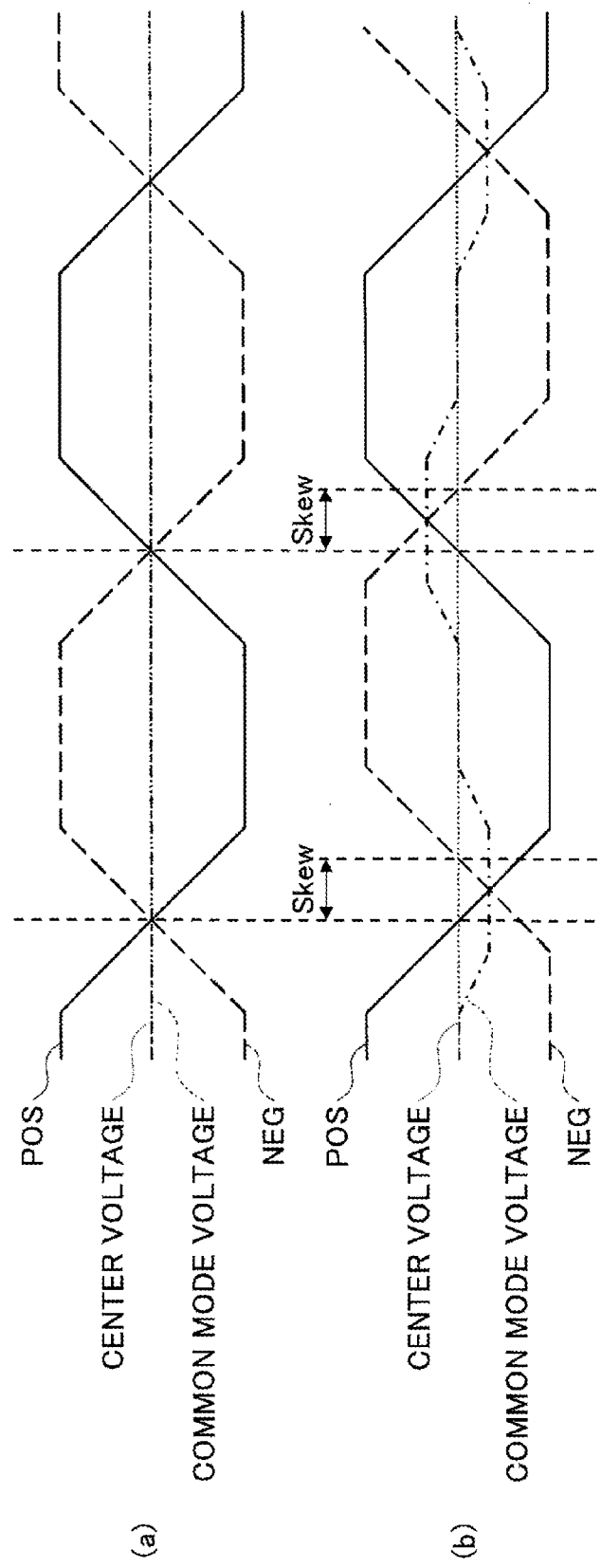
FIG. 2 is a waveform diagram for describing a differential signal skew.

With reference to FIG. 2, a description is given of a differential signal skew between a positive signal (POS) and a negative signal (NEG) of differential signals. Ideally, as illustrated in FIG. 2 (a), the timing when the positive signal intersects with the center voltage and the timing when the negative signal intersects with the center voltage match each other. A center voltage is the voltage at the center of the amplitude of each of the positive signal and the negative signal. Here, it is assumed that the center voltage of the positive signal and the center voltage of the negative signal match each other.

Due to some factors as described below, when a temporal difference (hereinafter, "differential signal skew") occurs between the positive signal and the negative signal, as illustrated in FIG. 2 (b), the timing when the positive signal intersects with the center voltage and the timing when the negative signal intersects with the center voltage do not match each other. The differential signal skew corresponds to a difference between the timing when the positive signal intersects with the center voltage and the timing when the negative signal intersects with the center voltage (indicated by "Skew" in FIG. 2 (b)). In FIG. 2, a common mode voltage is a voltage corresponding to half the sum of the positive signal voltage and the negative signal voltage of the differential signals.

Figure 3:
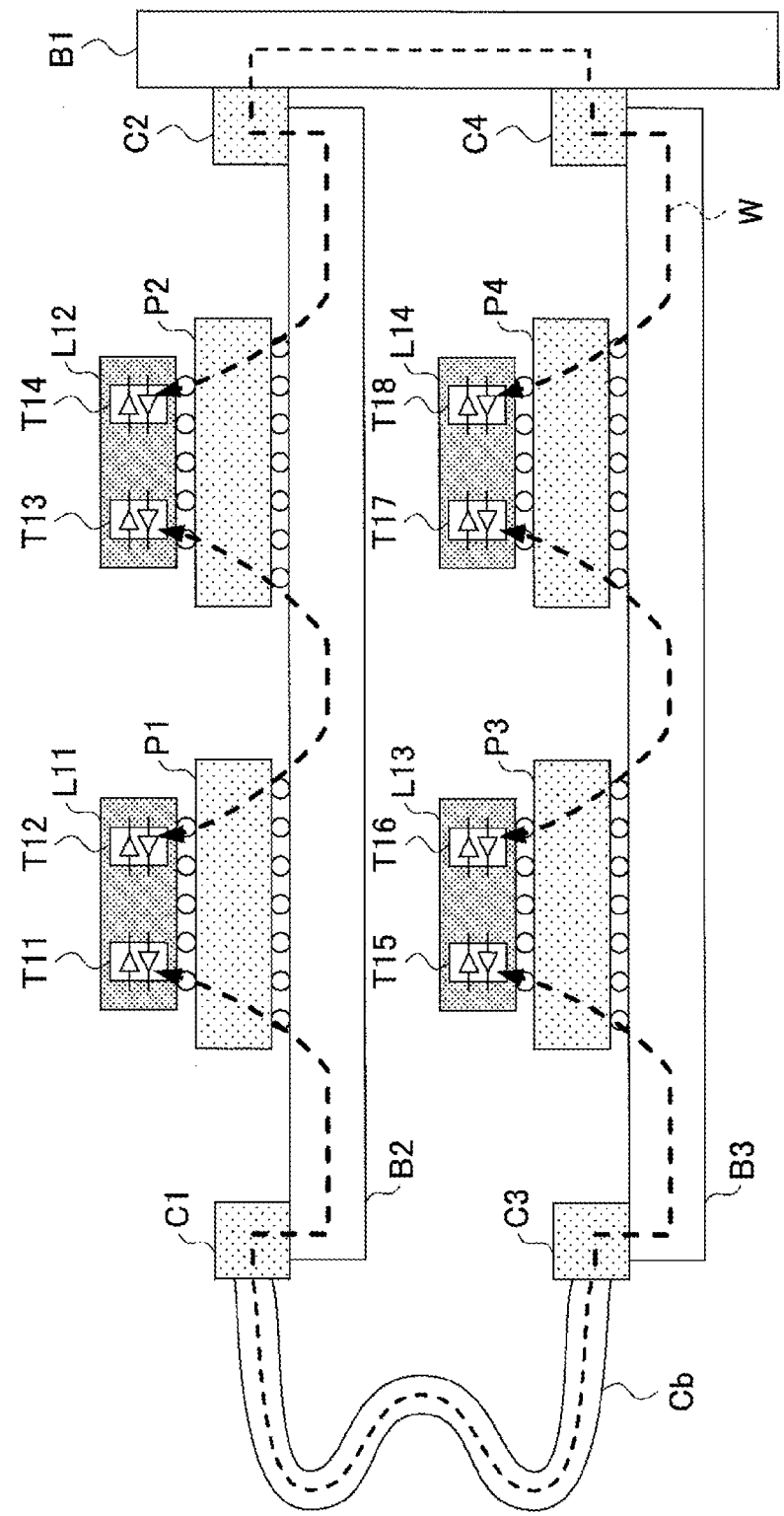
FIG. 3 is a side view of an information processing device according to an embodiment having another configuration.

Next, with reference to FIG. 3, a description is given of factors why the differential signal skew occurs.

FIG. 3 illustrates an example of an information processing device having the same configuration as that of FIG. 1. However, in the configuration example of FIG. 3 includes four LSIs (L11 through L14). Among these, the LSIs L11, L12 are mounted on a substrate B2, and the LSIs L13, L14 are mounted on a substrate B3. Furthermore, the substrates B2, B3 are respectively attached to the substrate B1. The LSIs L11 through L14 are respectively mounted on the substrates B2, B3 via packages P1 through P4 as illustrated in FIG. 3. Furthermore, the LSIs L11 through L14 are respectively provided with transmission/reception devices T11 through T18 having the same configuration as the transmission/reception devices T1 through T4 described above with reference to FIG. 1.

Furthermore, in FIG. 3, the dashed line W indicates a transmission line connecting the four LSIs L11 through L14. The transmission line W has the following configuration. That is to say, for example, differential signals, which are sent from a driver circuit (a driver circuit 13 described below with reference to FIG. 5, etc.) included in the transmission/reception device T12 of the LSI L11, pass through the transmission path inside the package P1 and reach the wirings on the substrate B2. Next, the differential signals sent from T12 pass through the wirings on the substrate B2, reach the adjacent package P2, pass through the transmission path inside the package P2, and reach a receiver circuit (a receiver circuit 23 described below with reference to FIG. 5, etc.) inside the transmission/reception device T13 of the LSI L12. Furthermore, when there is a connection between different substrates B2, B3, connectors C1 through C4 and a cable Cb, etc., are appropriately used. The factors of the differential signal skew occurring in these transmission lines W are as follows.

(1) Factor of differential signal skew caused by driver circuit.
(2) Failure of layout between differential wirings (wirings of positive signals and wirings of negative signals) of the transmission line W.
(3) Difference in dielectric constant between differential wirings caused by the fiber direction of the substrate material (referred to as Fiber Weave Effect).
(4) Factor of differential signal skew caused by circuit on receiving side including the receiver circuit.

Here, when correction of the differential signal skew is performed at the transmission/reception device on the sending side, among the above four factors (1) through (4), the factors (2) through (4) are not considered. Thus, a differential signal skew may remain at the transmission/reception device on the receiving side. Incidentally, in the configuration described in Patent Document 3 mentioned above, which is an example where the differential signal skew is adjusted with a driver by using a reflection wave, the differential signal skew is not corrected at the receiving side device.

Meanwhile, when correcting the differential signal skew at the transmission/reception device on the receiving side, common mode noise in the sending side LSI may occur due to the factor (1) above. The common mode noise is noise caused by a differential signal skew and is a noise caused by a common mode current that is caused by a variation in the common mode voltage that is a voltage corresponding to half the sum of the positive signal voltage and the negative signal voltage of the differential signals. If there is no differential signal skew, the common mode voltage is constantly fixed, and a common mode current is not generated and common mode noise does not occur.

Furthermore, in the case of a driver circuit of an ideal differential transmission method, a current of rising drive and a current of falling drive cancel out each other between the positive signal and the negative signal of differential signals, and therefore a rapid current variation is prevented. Meanwhile, when a differential signal skew occurs, the currents do not sufficiently cancel out each other, a variation in the common mode current occurs, and power source noise increases in the LSI, which may lead to malfunction. Furthermore, in the above transmission line W, a differential signal skew may be a factor of radiation noise.

According to an embodiment of the present invention, the occurrence of a differential signal skew in a high-speed serial link using a differential transmission method is detected by both the sending side and the receiving side, and the differential signal skew is corrected separately at the sending side and the receiving side.

A first embodiment of the present invention is described below.

Figure 4:
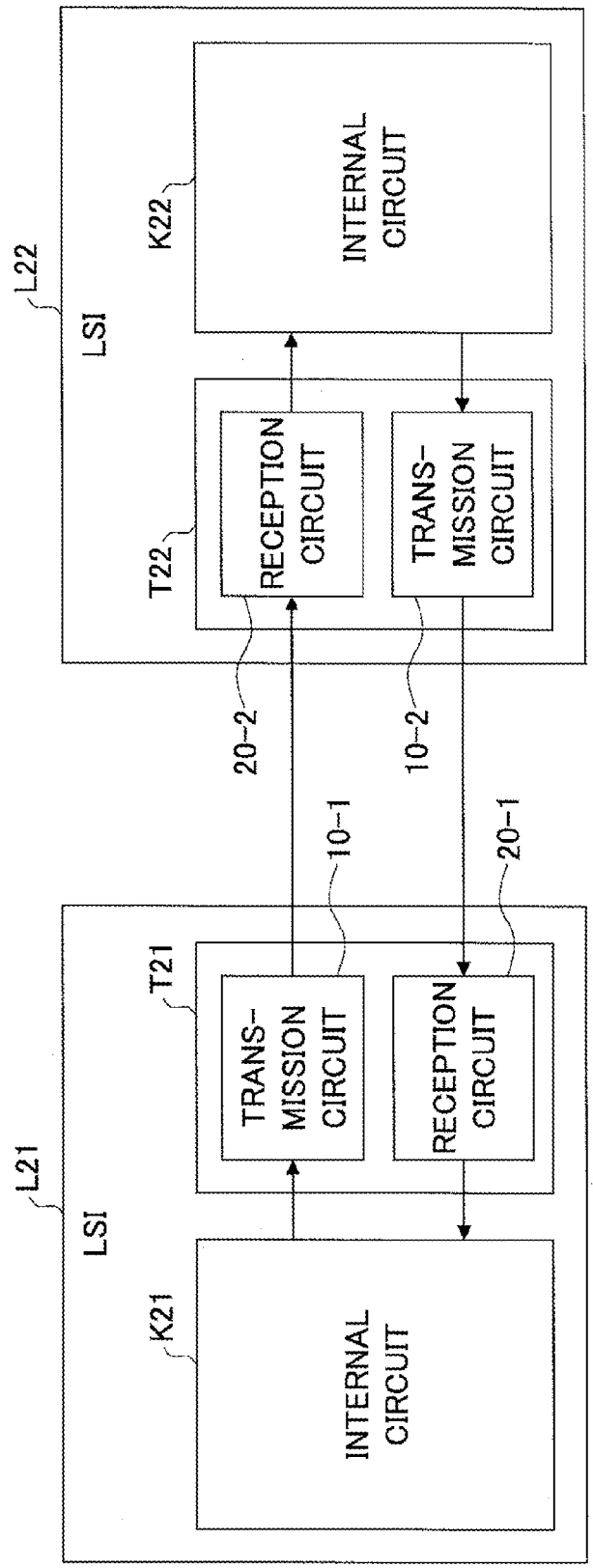
FIG. 4 is a block diagram for describing a configuration of a transmission/reception device in the configuration example of the information processing device illustrated in FIG. 1.

FIG. 4 is a block diagram for describing a configuration of a transmission/reception device according to a first embodiment. In FIG. 4, LSIs L21 and L22 correspond to, for example, LSIs L1 and L2 or LSIs L2 and L3 illustrated in FIG. 1. Internal circuits K21 and K22 respectively correspond to internal circuits K1 and K2 or the internal circuit K2 and the storage circuit K3. Similarly, transmission/reception devices T21 and T22 respectively correspond to transmission/reception devices T1 and T2 or transmission/reception devices T3 and T4.

As illustrated in FIG. 4, the transmission/reception device T21 includes a transmission circuit 10-1 and a reception circuit 20-1, and the transmission/reception device T2 includes a transmission circuit 10-2 and a reception circuit 20-2. The transmission circuit 10-1 sends data to the reception circuit 20-2 and the transmission circuit 10-2 sends data to the reception circuit 20-1. As described above, the LSIs L21 and L22 perform transmission/reception of data with each other, via the transmission circuit 10-1 and reception circuit 20-2, and the reception circuit 20-1 and the transmission circuit 10-2.

Figure 5:
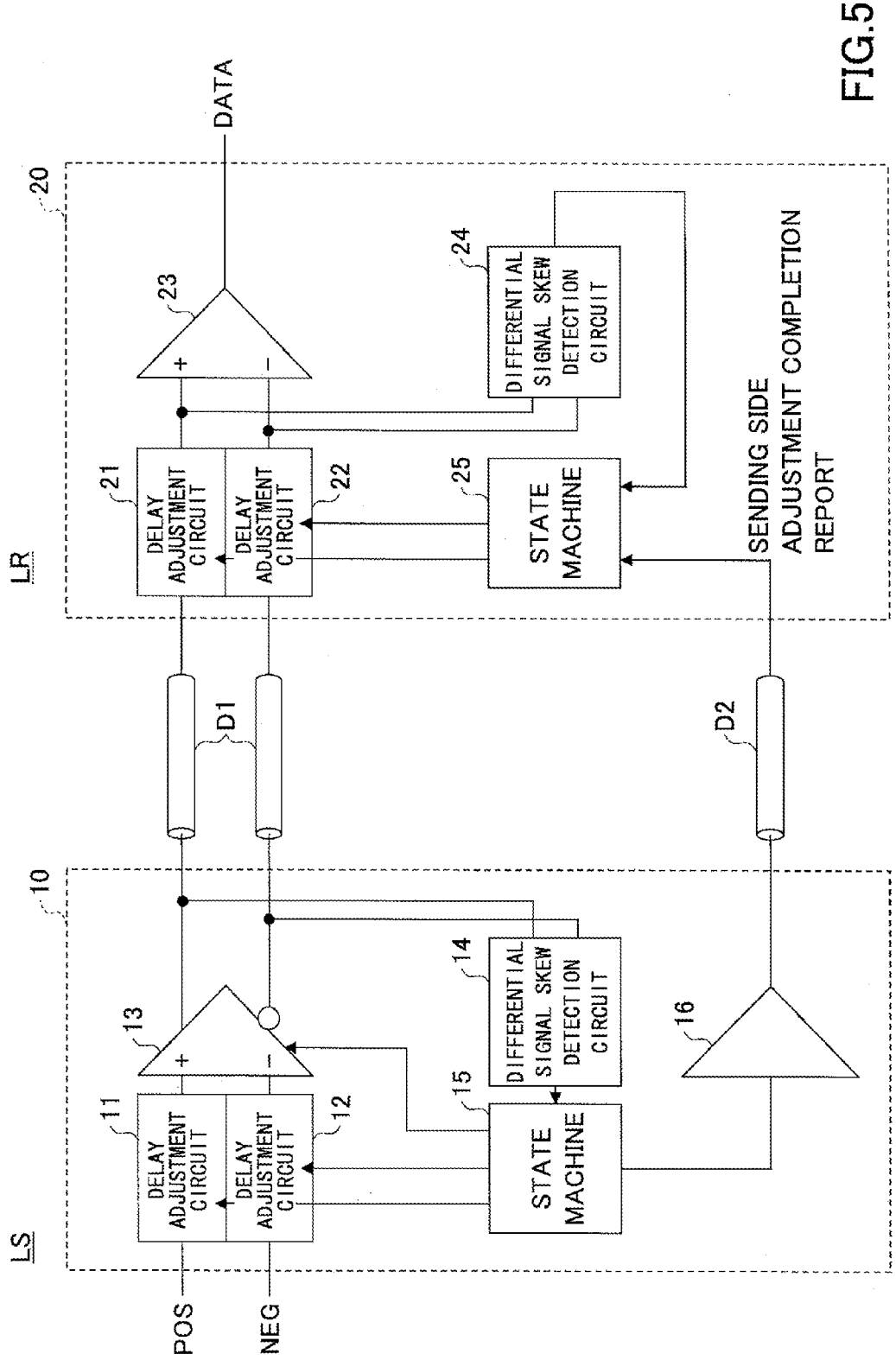
FIG. 5 is a circuit diagram of a configuration example of the transmission/reception device according to a first embodiment.

FIG. 5 illustrates a transmission circuit 10 included in the transmission/reception device of a LS that is the sending side LSI, and a reception circuit 20 included in the transmission/reception device of a LR that is the receiving side LSI. The transmission circuit 10 and the reception circuit 20 illustrated in FIG. 5 correspond to the transmission circuit 10-1 and the reception circuit 20-2 or the transmission circuit 10-2 and the reception circuit 20-1 illustrated in FIG. 4, respectively.

As illustrated in FIG. 5, the transmission circuit 10 includes a driver circuit 13 for transmitting data and delay adjustment circuits (first delay application units) 11, 12 for correcting a differential signal skew. The transmission circuit 10 further includes a differential signal skew detection circuit (first skew direction detection circuit) 14 for detecting the direction of the differential signal skew at the output terminal of the driver circuit 13. The transmission circuit 10 further includes a state machine (first control unit) 15 for controlling the delay adjustment circuits 11, 12 based on the detection result of the differential signal skew direction. The detection of the differential signal skew direction means to detect whether the positive signal is later than the negative signal in the differential signals, or whether the negative signal is later than the positive signal in the differential signals.

The transmission circuit 10 further includes an amplifier 16 (driver circuit) for sending a sending side adjustment completion report (differential signal skew correction completion report) indicating to the reception circuit 20 that the differential signal skew correction operation has been completed at the transmission circuit 10. Completion of the differential signal skew correction operation refers to a state where the differential signal skew has been determined to be less than or equal to a specified value (predetermined value) according to control by the state machine 15, as described below with reference to FIG. 6.

The reception circuit 20 includes a receiver circuit 23 for receiving data and delay adjustment circuits (second delay application units) 21, 22 for correcting a differential signal skew. The reception circuit 20 further includes a differential signal skew detection circuit (second skew direction detection unit) 24 for detecting the direction of the differential signal skew at the input terminal of the receiver circuit 23. The reception circuit 20 further includes a state machine (second control unit) 25 for controlling the delay adjustment circuits 21, 22 based on the detection result of the differential signal skew direction.

The transmission circuit 10 and the reception circuit 20 are connected by transmission lines D1, D2 corresponding to the transmission line W. The transmission line D1 is for performing transmission/reception of data and the transmission line D2 is for sending a sending side adjustment completion report. Here, the driver circuit 13 and the delay adjustment circuits 11, 12 of the transmission circuit 10, the transmission line D1, and the delay adjustment circuits 21, 22 and the receiver circuit 23 of the reception circuit 20, form a high-speed link. Meanwhile, the amplifier 16 of the transmission circuit 10 and the transmission line D2 form a low-speed link or a high-speed link operating a low speed.

Figure 6:
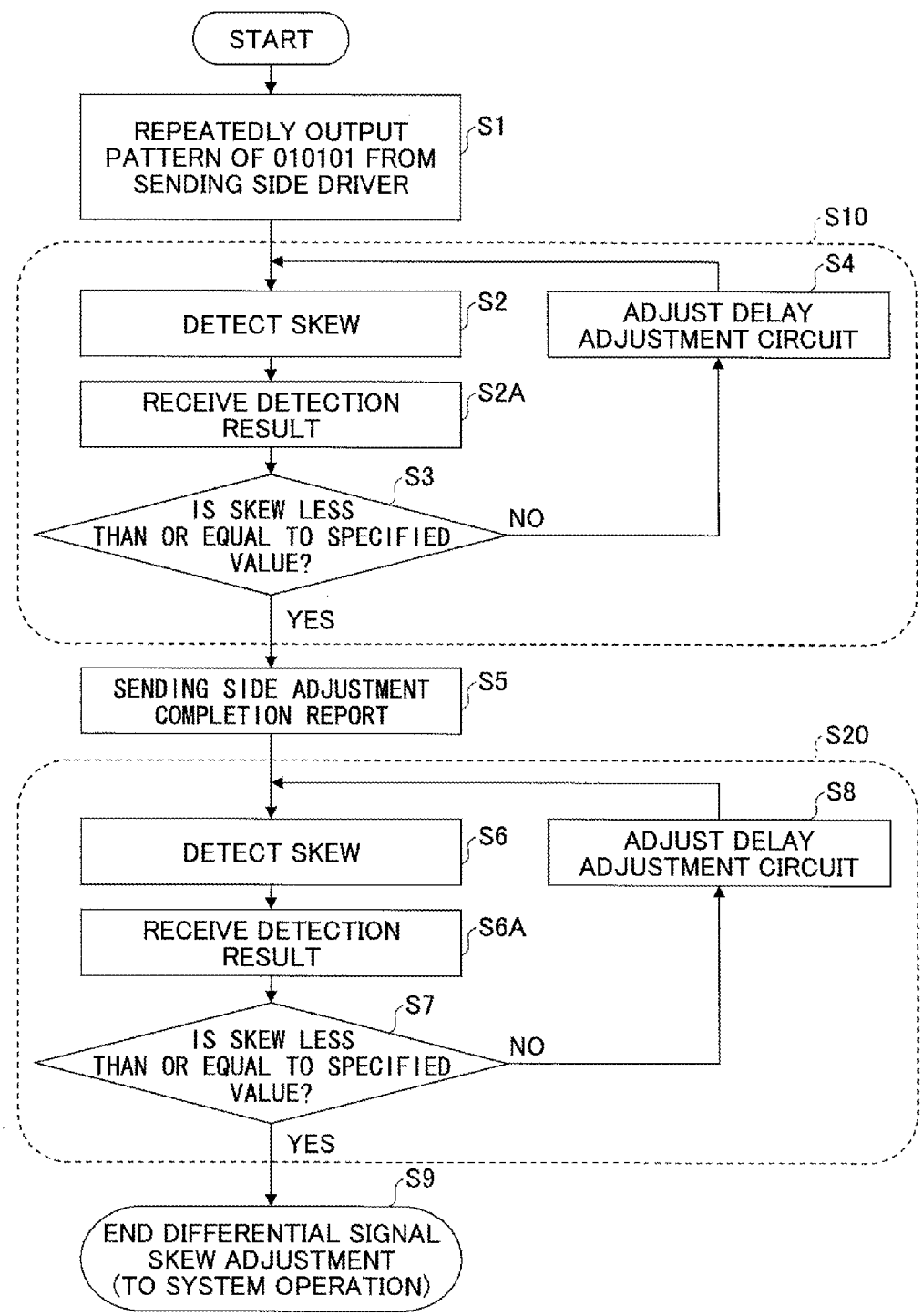
FIG. 6 is a flowchart indicating the flow of a differential signal skew correction operation by an example of the transmission/reception device according to the first embodiment.

Next, with reference to FIG. 6, a description is given of a flow of a differential signal skew correction operation executed by the transmission circuit 10 and the reception circuit 20 according to the first embodiment.

The transmission circuit 10 and the reception circuit 20 according to the first embodiment execute a training sequence for making various adjustments in the circuit, before performing regular data transmission/reception. The training sequence is executed by the state machines 15 and 25 of the transmission circuit 10 and the reception circuit 20, respectively. The differential signal skew correction operation is incorporated in the training sequence.

At the beginning of the differential signal skew correction operation, the state machine 15 of the transmission circuit 10 controls the driver circuit 13, and sends out a clock pattern as differential signals for detecting a differential signal skew (step S1). A clock pattern in FIG. 6 means a signal pattern in which data of "0" and "1" alternately and repeatedly appear, such as "01010101 . . . ." In a clock pattern, for example as illustrated in FIG. 2, high level (for example, "1") and low level (for example, "0") are alternately and periodically repeated. Furthermore, the negative signal of the differential signal is sent out in a state in which the high level and the low level of the positive signal are reversed.

Next, the state machine 15 starts the differential signal skew correction operation S10 of the sending side. That is to say, the state machine 15 receives, from the differential signal skew detection circuit 14, a detection result indicating which is the earlier signal between the positive signal and the negative signal of the differential signals (that is to say, the direction of the differential signal skew) (steps S2, S2A) (however, step S2 is the operation of the differential signal skew detection circuit 14). Next, the state machine 15 determines whether the differential signal skew is less than or equal to a specified value based on the detection result received from the differential signal skew detection circuit 14 (step S3). When the state machine 15 determines that the differential signal skew is not less than or equal to a specified value (NO in step S3), the state machine 15 proceeds to step S4. In step S4, the state machine 15 controls the delay adjustment circuit 11 or 12 so that the differential signal skew becomes less than or equal to the specified value.

Here, the delay adjustment circuit 11 has a function of applying, to a positive signal, a delay amount set by the state machine 15. Therefore, when the differential signal skew detection circuit 14 detects that the positive signal is earlier than the negative signal, in step S4, the state machine 15 controls the delay adjustment circuit 11, and increases the delay amount to be applied to the positive signal by a predetermined amount. Similarly, the delay adjustment circuit 12 has a function of applying, to the negative signal, a delay amount set by the state machine 15. When the differential signal skew detection circuit 14 detects that the negative signal is earlier than the positive signal, in step S4, the state machine 15 controls the delay adjustment circuit 12 and increases the delay amount to be applied to the negative signal by a predetermined amount. After controlling the delay adjustment circuit, the state machine 15 executes steps S2, S2A.

A description is given of an example of a method of adjusting the differential signal skew to be less than or equal to a specified value. First, as an initial state, the delay amounts of the delay adjustment circuits 11, 12 are set at a minimum value. Then, when the skew is determined to be less than or equal to the specified value in step S3, in step S4, the delay amount of either one of the delay adjustment circuit 11 or 12 is increased by a predetermined value according to the detection result of the skew direction in step S2. For example, when a detection result in step S2 indicates that the positive signal is earlier, in step S4, the delay amount of the delay adjustment circuit 11 is increased by a predetermined amount.

As a result of adjusting the delay adjustment circuit in step S4, when the direction of the differential signal skew detected in step S2 is reversed, the state machine 15 stores the value of the delay amount of the delay adjustment circuit 11 at this time point in a memory. When the direction of the differential signal skew is not reversed, the state machine 15 executes the process of step S4 once again, and increases the delay amount of the delay adjustment circuit by a predetermined amount. At this time, the delay amount of the delay adjustment circuit is increased gradually, by a predetermined amount at a time.

When the direction of the differential signal skew is reversed, next, in step S4, this time the delay amount of the delay adjustment circuit 11 is gradually decreased by a predetermined amount at a time. As a result of decreasing the delay amount of the delay adjustment circuit, when the direction of the differential signal skew detected in step S2 is reversed once again, the state machine 15 obtains the center value of the value of the delay amount of the delay adjustment circuit 11 at this time point and the value of the delay amount stored in the above memory. Then, the state machine 15 sets, in the delay adjustment circuit 11, the center value as the delay amount after completing the differential signal skew correction. As the delay amount after the correction is completed is set, the state machine 15 determines that the differential signal skew is less than or equal to the specified value (step S3). When the detection result in step S2 indicates that the negative signal is earlier, in step S4, the delay amount is increased or decreased for the delay adjustment circuit 12 instead of for the delay adjustment circuit 11, and similar procedures are executed.

In step S3, when the differential signal skew is determined to be less than or equal to a specified value, the state machine 15 sends a sending side adjustment completion report to the reception circuit 20 (step S5). When the sending side adjustment completion report is received, the state machine 25 of the reception circuit 20 starts a differential signal skew correction operation S20. That is to say, the state machine 25 receives a detection result indicating which is the earlier signal between the positive signal and the negative signal of the differential signals (that is to say, the direction of the differential signal skew) (steps S6, S6A) (however, step S6 is the operation of the differential signal skew detection circuit 24). Next, the state machine 25 determines whether the differential signal skew is less than or equal to a specified value based on the detection result received from the differential signal skew detection circuit 24 (step S7). When the state machine 25 determines that the differential signal skew is not less than or equal to a specified value, the state machine 25 proceeds to step S8. In step S8, the state machine 25 controls the delay adjustment circuit 21 or 22 so that the differential signal skew becomes less than or equal to the specified value.

Here, the delay adjustment circuit 21 has a function of applying, to a positive signal, a delay amount set by the state machine 25. Therefore, when the differential signal skew detection circuit 24 detects that the positive signal is earlier than the negative signal, in step S8, the state machine 25 controls the delay adjustment circuit 21, and increases the delay amount to be applied to the positive signal by a predetermined amount. Similarly, the delay adjustment circuit 22 has a function of applying, to the negative signal, a delay amount set by the state machine 25. When the differential signal skew detection circuit 24 detects that the negative signal is earlier than the positive signal, the state machine 25 controls the delay adjustment circuit 22 and increases the delay amount to be applied to the negative signal by a predetermined amount. Subsequently, the state machine 25 executes steps S6, S6A.

The method of adjusting the differential signal skew to less than or equal to a specified value in step S7 is the same as the method of adjusting the differential signal skew of steps S2 through S4 described above. When the differential signal skew is determined to be less than or equal to a specified value in step S7, the state machine 25 ends the differential signal skew correction operation S20, and as a result, the differential signal skew correction operations of both the sending side and the receiving side end (step S9). Subsequently, the state machine 25 reports, to the LSI LS of the sending side and the LSI LR of the receiving side, that the differential signal skew correction operation has ended through a transmission line (not illustrated). In response to this report, regular data transmission from the LSI LS of the sending side to the LSI LR of the receiving side is started.

Figure 7:
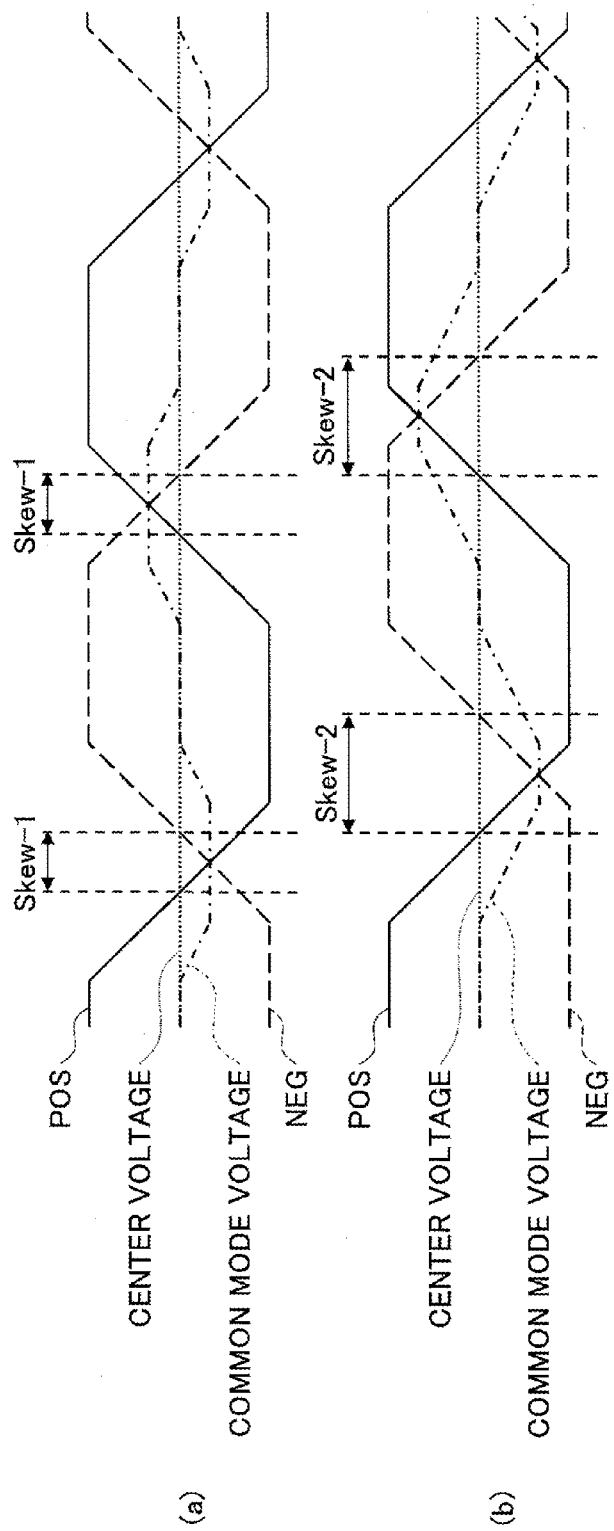
FIG. 7 is a waveform diagram (before correction) for describing a specific example of differential signal skew correction by an example of the transmission/reception device according to the first embodiment.
Figure 8:
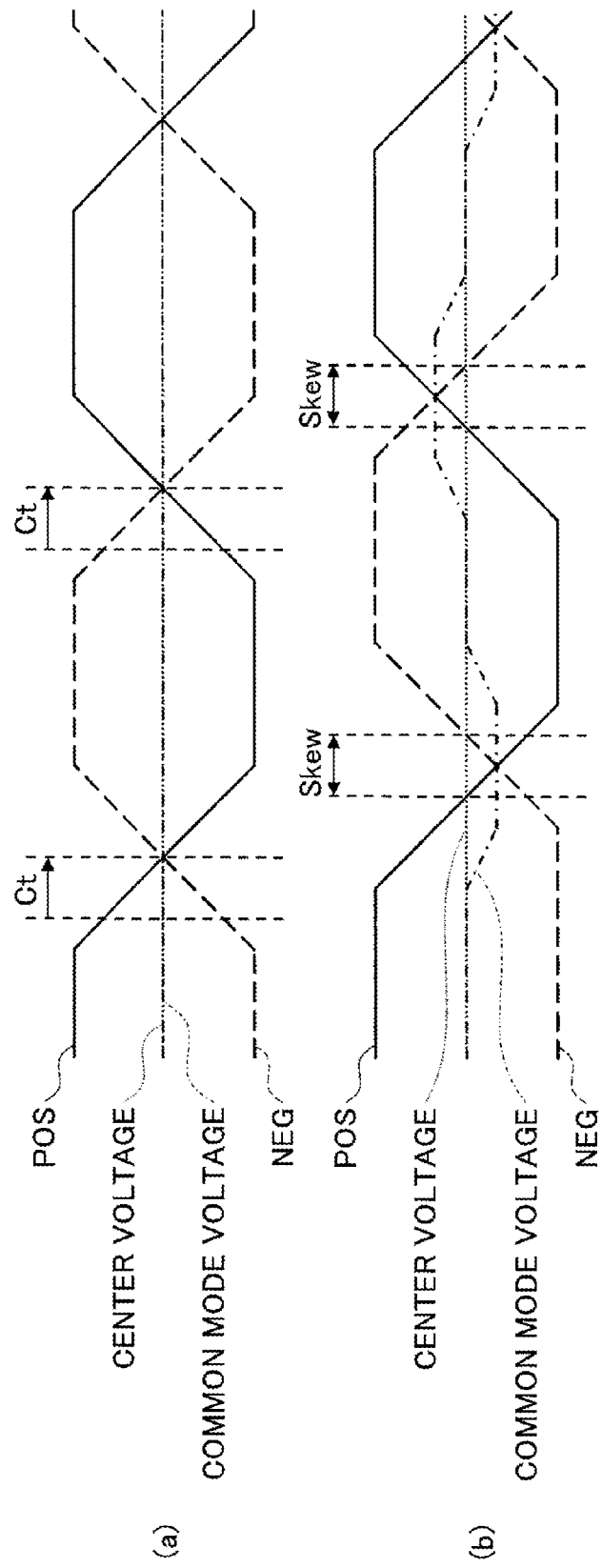
FIG. 8 is a waveform diagram (after correction on sending side) for describing a specific example of differential signal skew correction by an example of the transmission/reception device according to the first embodiment.
Figure 9:
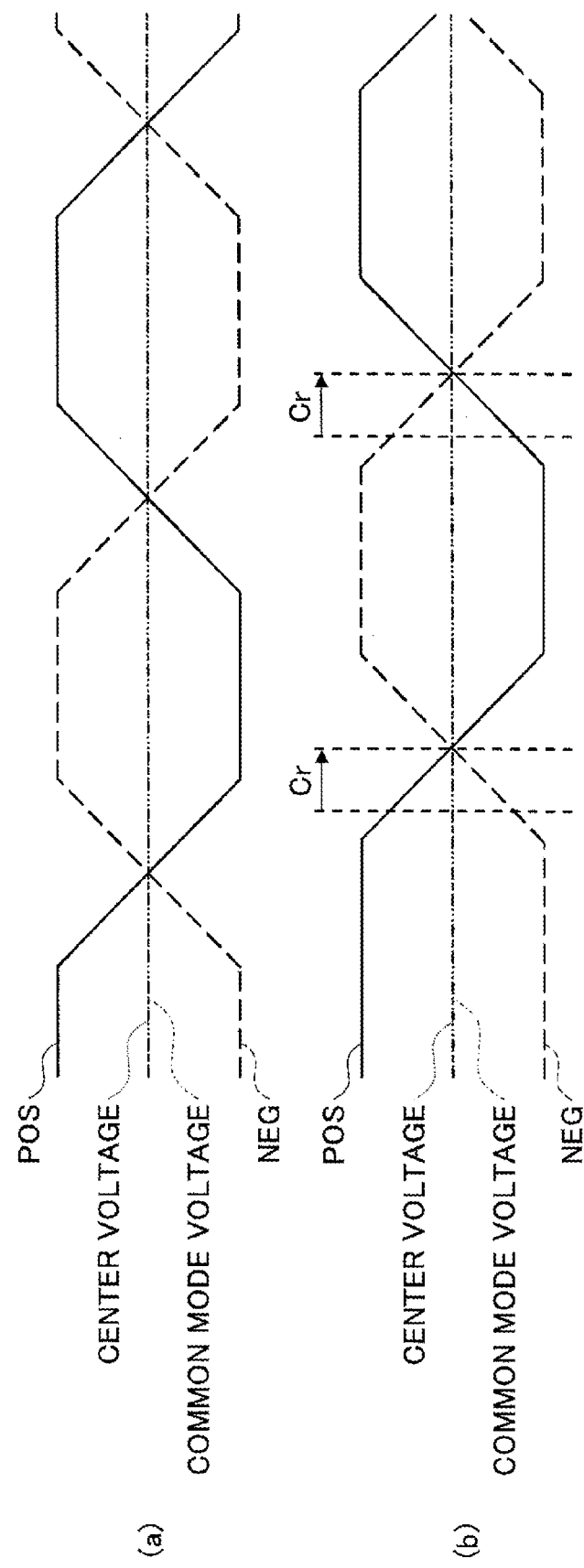
FIG. 9 is a waveform diagram (after correction on receiving side) for describing a specific example of differential signal skew correction by an example of the transmission/reception device according to the first embodiment.

Next, with reference to FIGS. 7, 8, and 9, a description is given of a specific example of differential signal skew correction. FIGS. 7, 8, and 9 illustrate a voltage waveform of a positive signal POS and a negative signal NEG of differential signals, and waveforms of a center voltage and a common mode voltage. Furthermore, FIGS. 7 and 8 indicate a differential signal skew "Skew". In FIGS. 7, 8, and 9, (a) illustrates the state of signals in the transmission circuit 10 and (b) illustrates the state of signals in the reception circuit 20.

FIG. 7 illustrates a state before performing differential signal skew correction in both the transmission circuit 10 and the reception circuit 20. In the state of FIG. 7, from both the transmission circuit 10 and the reception circuit 20, differential signal skews Skew-1 and Skew-2 are generated, respectively. In this case, the positive signal POS has an earlier phase than the negative signal NEG. As a result, the timing at which the positive signal POS intersects with the center voltage is earlier than the timing at which the negative signal NEG intersects with the center voltage. The difference in the timing between the two signals corresponds to differential signal skews Skew-1 and Skew-2. As a result of the generation of the differential signal skews Skew-1 and Skew-2, in both the transmission circuit 10 and the reception circuit 20, the common mode voltage changes with respect to the center voltage.

FIG. 8 illustrates a state where differential signal skew correction has been completed only in the transmission circuit 10 (that is to say, in FIG. 6, the differential signal skew correction operation on the sending side S10 has ended). In this differential signal skew correction, as indicated in FIG. 8 (a), the positive signal POS is delayed by a time Ct which is the same time as the differential signal skew Skew-1 illustrated in FIG. 7 (a) at the transmission circuit 10, so that the differential signal skew becomes zero. As a result, the common mode noise in the LSI LS on the sending side is mitigated. The differential signal skew Skew-1 at the transmission circuit 10 is generated due to a factor at the transmission circuit 10.

However, as illustrated in FIG. 8 (b), as a result of differential signal skew correction at the transmission circuit 10, the differential signal skew Skew has also decreased at the reception circuit 20 compared to the state of FIG. 7 (b) but has not become zero. The differential signal skew Skew at the reception circuit 20 is, for example, generated due to a factor in the transmission line W from the transmission circuit 10.

FIG. 9 illustrates a state where differential signal skew correction has been completed also in the reception circuit 20 (that is to say, in FIG. 6, both the differential signal skew correction operation on the sending side S10 and the differential signal skew correction operation on the receiving side S20 have ended). In this differential signal skew correction, as indicated in FIG. 9 (b), the positive signal POS is delayed by a time Cr which is the same time as the differential signal skew Skew illustrated in FIG. 8 (b) at the transmission circuit 10, so that the differential signal skew becomes zero. As a result, as illustrated in FIG. 9 (a) and FIG. 9 (b), in both the transmission circuit 10 and the reception circuit 20, the differential signal skew has become zero. As a result, in both the transmission circuit 10 and the reception circuit 20, the common mode voltage constantly matches the center voltage, and the common mode noise is mitigated in the transmission line W and the LSI LR of the receiving side.

As described above, according to the first embodiment of the present invention, in a high-speed serial link using a differential transmission method, the differential signal skew is separately detected in the transmission circuit 10 and the reception circuit 20. Then, the detection result of the differential signal skew is fed back to the delay adjustment circuits 11, 12, 21, and 22, and differential signal skew correction is executed separately in the transmission circuit 10 and the reception circuit 20 according to the direction of the detected differential signal skew. Specifically, a delay is purposely applied to the positive signal or negative signal with the use of the delay adjustment circuits 11, 12, 21, and 22, to correct the differential signal skew. As a result, throughout the transmission circuit 10, the reception circuit 20, and all paths of the transmission line W in both directions, differential signal skew correction is achieved, the differential signal skew is mitigated, common mode noise is mitigated, and differential signals are stably transmitted.

Figure 10:
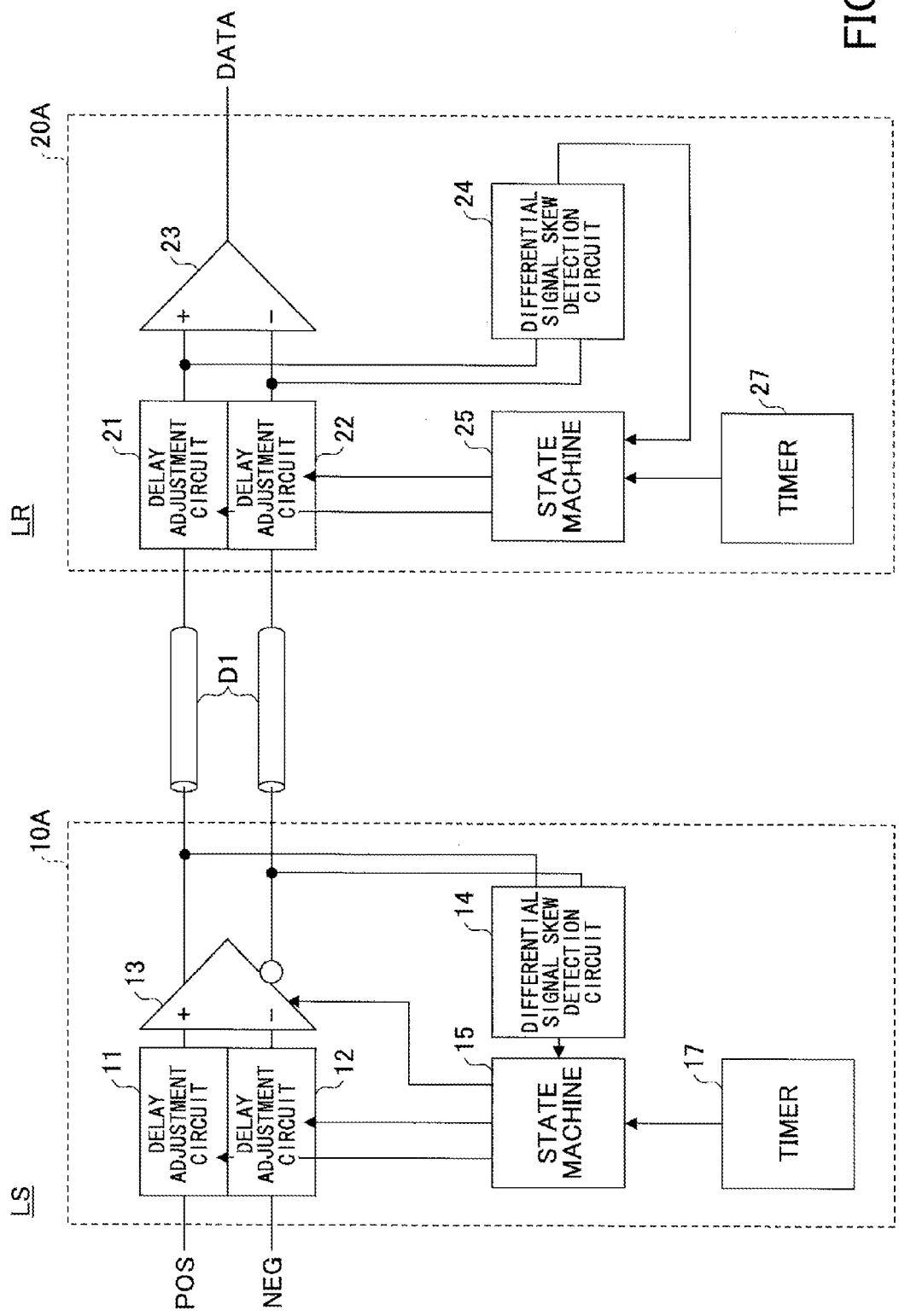
FIG. 10 is a circuit diagram of a configuration example of a transmission/reception device according to a second embodiment.
Figure 11:
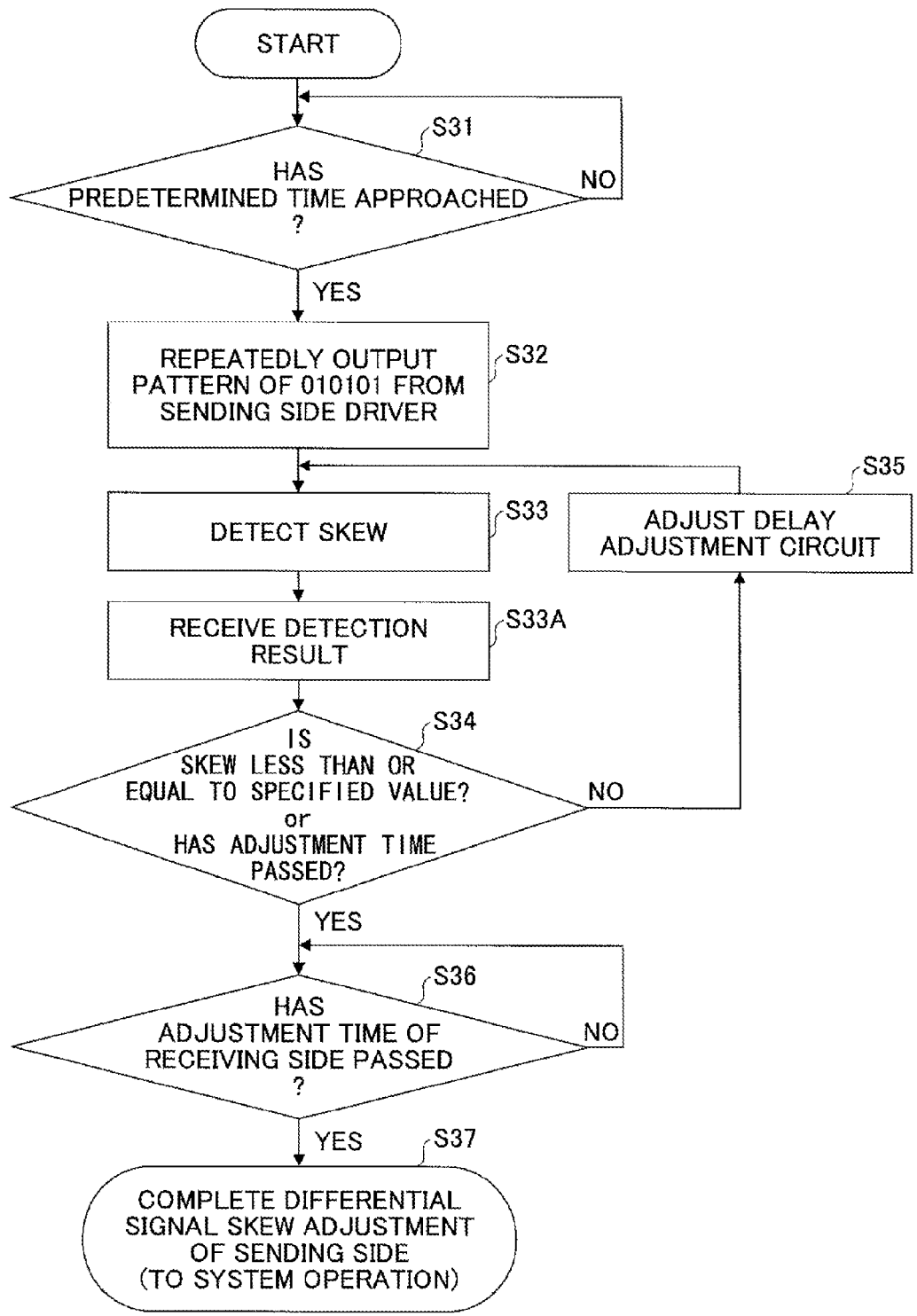
FIG. 11 is a flowchart indicating the flow of a differential signal skew correction operation by an example of the transmission/reception device according to the second embodiment (sending side differential signal skew correction).
Figure 12:
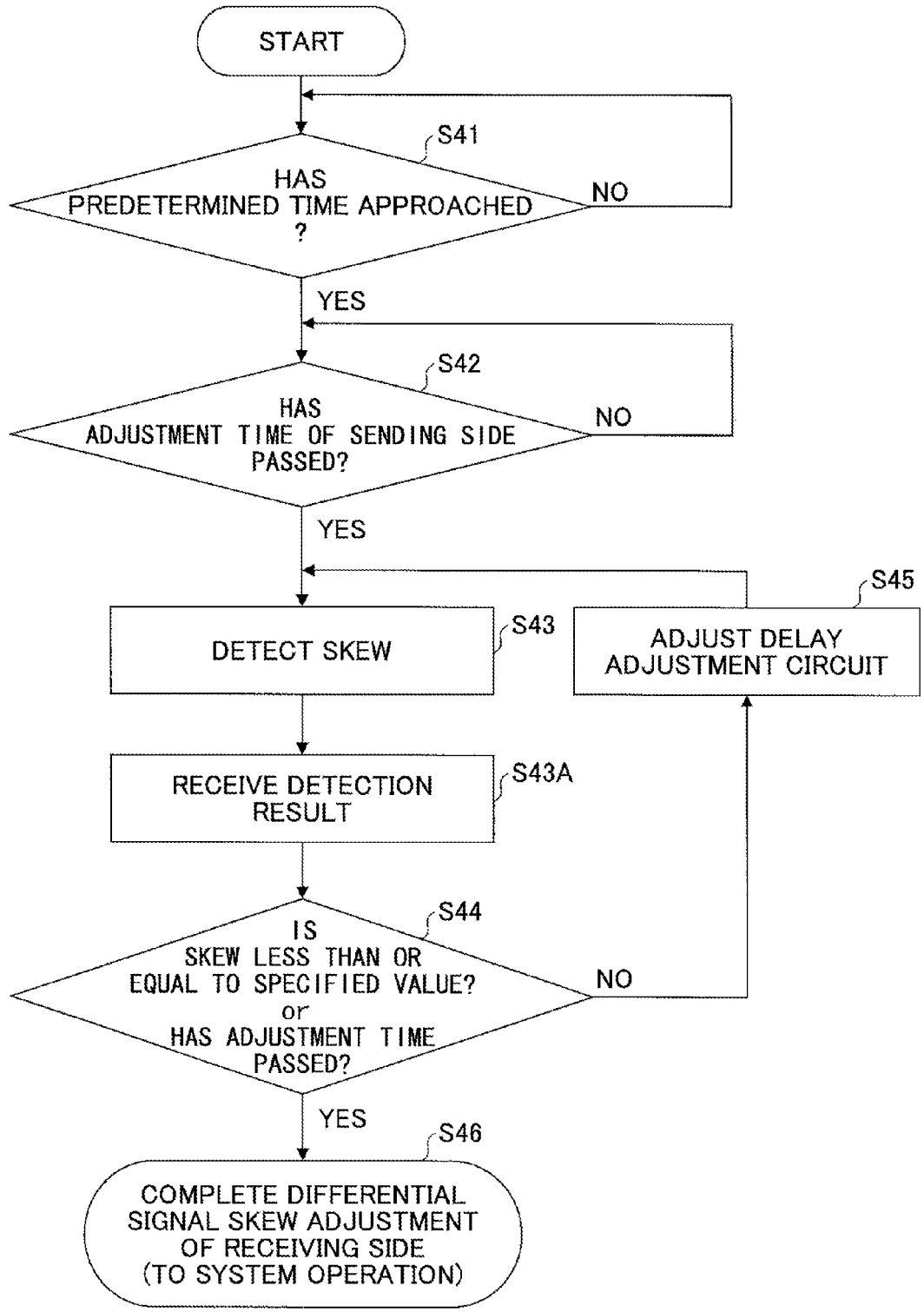
FIG. 12 is a flowchart indicating the flow of a differential signal skew correction operation by an example of the transmission/reception device according to the second embodiment (receiving side differential signal skew correction).

Next, with reference to FIGS. 10, 11, and 12, a description is given of a second embodiment of the present invention.

In the first embodiment, at the stage where differential signal skew correction is completed at the transmission circuit 10, a sending side adjustment completion report is sent to the reception circuit 20, and the reception circuit 20 receives the report and starts a differential signal skew correction operation. By this method, it is possible to perform, without waste, the state transition from the differential signal skew correction operation at the transmission circuit 10 to the differential signal skew correction operation at the reception circuit 20. However, by this method, in the case of the configuration example illustrated in FIG. 5, a transmission line D2 needs to be separately provided for sending the sending side adjustment completion report.

According to the second embodiment of the present invention described below, according to the functions of timers 17, 27 described below with reference to FIG. 10, operations are synchronized between the sending side LSI LS and the receiving side LSI LR. The timings of starting and ending the operation of the state machine 15 are adjusted by the function of the timer 17. The timings of starting and ending the operation of the state machine 25 are adjusted by the function of the timer 27. Thus, it is possible to realize differential signal skew adjustment without separately providing a transmission line D2 for sending the sending side adjustment completion report.

FIG. 10 illustrates a transmission circuit 10A of the sending side LSI LS and a reception circuit 20A of the receiving side LSI LR. FIG. 10 illustrates the transmission circuit 10A and the reception circuit 20A respectively corresponding to the transmission circuit 10-1 or the transmission circuit 10-2 and the reception circuit 20-2 or the reception circuit 20-1 illustrated in FIG. 4. In FIG. 10, elements corresponding to those in the configuration of the first embodiment illustrated in FIG. 5 are denoted by the same reference numerals, and overlapping descriptions are omitted. Elements in the configuration of the second embodiment illustrated in FIG. 10 that are different from those of the configuration of the first embodiment illustrated in FIG. 5 are as follows. Instead of providing the transmission line D2 and the amplifier 16 for sending the sending side adjustment completion report, as illustrated in FIG. 10, the timers 17, 27 are provided in the transmission circuit 10A and the reception circuit 20A, respectively. Operations of the timers 17, 27 are described in the descriptions of FIGS. 11 and 12 below.

With reference to FIGS. 11 and 12, a description is given of a flow of operations of a transmission/reception device according to the second embodiment of the present invention.

First, when an information processing device (for example, the information processing device 100 in FIG. 1), which has LSI LS, LR respectively including a transmission/reception device, is activated, the timers 17, 27 are activated at the same time. After being activated, when a predetermined sending side correction start time Tss passes, the timers 17, 27 output a report indicating that the sending side correction start time Tss has passed to the corresponding state machines 15, 25, respectively. Next, when a predetermined sending side correction completion time Tse passes, the timers 17, 27 output a report indicating that the sending side correction completion time Tse has passed to the corresponding state machines 15, 25, respectively. Next, when a predetermined receiving side correction completion time Tre passes, the timers 17, 27 output a report indicating that the receiving side correction completion time Tre has passed to the corresponding state machines 15, 25, respectively. Here, the comparative relationship of the times is "predetermined sending side correction start time Tss"<"predetermined sending side correction completion time Tse"<"predetermined receiving side correction completion time Tre".

First, the timer 17 of the transmission circuit 10A reports to the state machine 15 that the sending side correction start time Tss has passed (YES in step S31 of FIG. 11). Then, the state machine 15 starts a differential signal skew correction operation. The state machine 15 controls the driver circuit 13, and causes the driver circuit 13 to send out a clock pattern as differential signals for differential signal skew detection, similar to step S1 of FIG. 5 (step S32).

Next, the state machine 15 receives, from the differential signal skew detection circuit 14, a detection result indicating which one of the positive signal or the negative signal of the sent out differential signals is earlier (that is to say, the direction of differential signal skew), similar to steps S2, S2A of FIG. 5 (steps S33, S33A) (however, the operation of step S33 is the operation of the differential signal skew detection circuit 14). Furthermore, the state machine 15 determines whether the differential signal skew is less than or equal to a specified value, similar to step S3 of FIG. 5 (step S34). Furthermore, in step S34, the state machine 15 determines whether a report indicating that the sending side correction completion time Tse has passed has been received from the timer 17 (step S34). When the state machine 15 determines that the differential signal skew is not less than or equal to a specified value, and that a report indicating that the sending side correction completion time Tse has passed has not been received, the state machine 15 proceeds to step S35. In step S35, the delay adjustment circuit 11 or 12 is controlled so that the differential signal skew becomes less than or equal to a specified value, similar to step S4 of FIG. 5. Subsequently, steps S33 and S33A are executed.

In step S34, when the state machine 15 determines that the differential signal skew is less than or equal to a specified value, or that a report indicating that the sending side correction completion time Tse has passed has been received from the timer 17, the state machine 15 proceeds to step S36. In step S36, the state machine 15 determines whether a report indicating that the receiving side correction completion time Tre has passed has been received from the timer 17. When a report indicating that the receiving side correction completion time Tre has passed has been received from the timer 17, the process proceeds to step S37, and when the report is not received, step S36 is repeatedly executed.

When the state machine 25 of the reception circuit 20 receives a report indicating that the sending side correction start time Tss has passed from the timer 27 (YES in step S41), the process proceeds to step S42. Furthermore, subsequently, when the state machine 25 of the reception circuit 20 receives a report indicating that the sending side correction completion time Tse has passed from the timer 27 (YES in step S42), the state machine 25 starts the differential signal skew correction operation of the receiving side.

That is to say, the state machine 25 receives, from differential signal skew detection circuit 24, a detection result indicating which one of the positive signal or the negative signal of the differential signals received from the transmission circuit 10 is earlier (that is to say, the direction of differential signal skew), similar to steps S6, S6A of FIG. 5 (steps S43, S43A) (however, the operation of step S43 is the operation of the differential signal skew detection circuit 24). Furthermore, the state machine 25 determines whether the differential signal skew is less than or equal to a specified value, similar to step S7 of FIG. 5 (step S44). Furthermore, in step S44, the state machine 25 determines whether a report indicating that the receiving side correction completion time Tre has passed has been received from the timer 27. When the state machine 25 determines that the differential signal skew is not less than or equal to a specified value, and that a report indicating that the receiving side correction completion time Tre has passed has not been received, the state machine 25 proceeds to step S45. In step S45, the state machine 25 controls the delay adjustment circuit 21 or 22 so that the differential signal skew becomes less than or equal to the specified value, similar to step S8 of FIG. 5. Subsequently, steps S43 and S43A are executed.

In step S44, when the state machine 25 determines that the differential signal skew is less than or equal to a specified value, or that a report indicating that the receiving side correction completion time Tre has passed has been received from the timer 27, the state machine 25 proceeds to step S46. In step S46, the state machine 25 ends the differential signal skew correction operation, and as a result, the differential signal skew correction operations for both directions of transmission/reception are ended. At the latest, when the receiving side correction completion time Tre passes, the sending side correction completion time Tse has passed before that, and therefore the differential signal skew correction operation is ended at the transmission circuit 10A (steps S34→S36→S37). Furthermore, the differential signal skew correction operation is ended also at the reception circuit 20A (steps S44→S46). After the processes illustrated in FIG. 11 and FIG. 12 are ended, regular data transmission from the sending side LSI LS to the receiving side LSI LR is started.

Next, with reference to FIGS. 13 through 19, a detailed description is given of the differential signal skew detection circuits 14, 24 having the configurations of the first and second embodiments illustrated in FIGS. 5 and 10, respectively.

Figure 13:
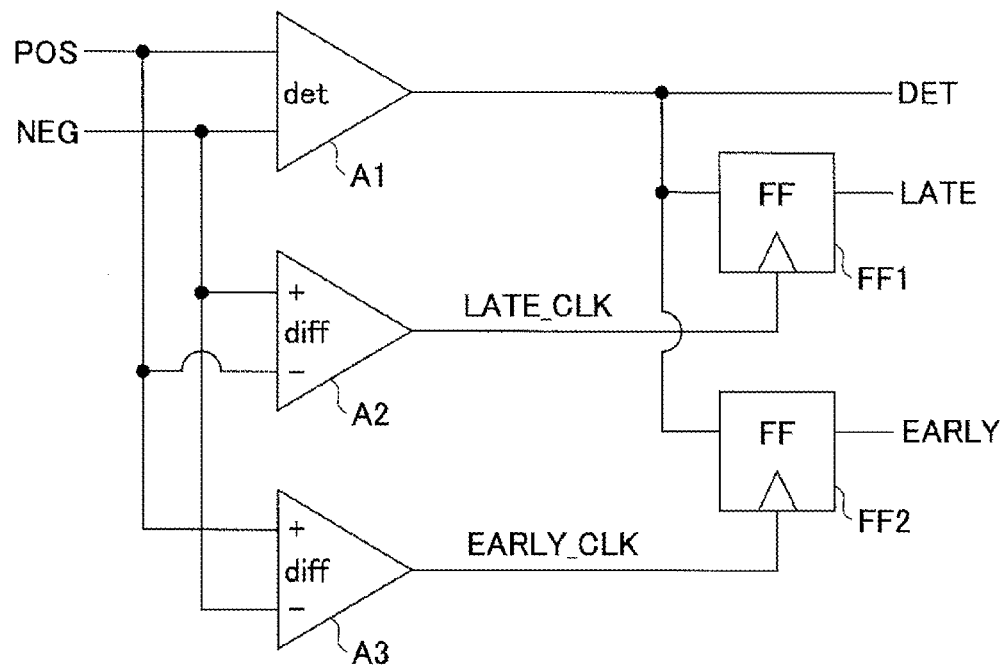
FIG. 13 is a circuit diagram of an example of a differential signal skew detection circuit according to an embodiment.

FIG. 13 illustrates a circuit example of a differential signal skew detection circuit. The differential signal skew detection circuit includes a detecting unit A1 into which positive signals POS and negative signals NEG of differential signals are input. Furthermore, the differential signal skew detection circuit includes a clock generating unit A2 and a clock generating unit A3 into which positive signals POS and negative signals NEG of differential signals are input.

The differential signal skew detection circuit further includes a flip flop (for example, a D flip flop) FF1, to which an output signal DET from the detecting unit A1 is applied to the data input terminal, and an output signal LATE_CLK of the clock generating unit A2 is applied to the clock input terminal. The differential signal skew detection circuit further includes a flip flop (for example, a D flip flop) FF2, to which an output signal DET from the detecting unit A1 is applied to the data input terminal, and an output signal EARLY_CLK of the clock generating unit A3 is applied to the clock input terminal. The flip flops FF1, FF2 take in the value of a signal applied to the data input terminal when the voltage applied to the clock input terminal rises, and thereafter holds the value that has been taken in until the next signal is taken in.

The differential signal skew detection circuit illustrated in FIG. 13 outputs the output DET of the detecting unit A1 as a signal indicating that there is a differential signal skew. The detecting unit A1 outputs a signal DET indicating that there is a differential signal skew. The operation of the detecting unit A1 is described below with reference to FIGS. 15 through 19. Furthermore, the differential signal skew detection circuit outputs an output LATE of the flip flop FF1 as a signal indicating that the negative signal NEG is later than the positive signal POS. Furthermore, the differential signal skew detection circuit outputs an output EARLY of the flip flop FF2 as a signal indicating that the negative signal NEG is earlier than the positive signal POS.

To the non-inverted input terminal of the clock generating unit A2, a negative signal NEG is input, and to the inverted input terminal of the clock generating unit A2, a positive signal POS is input. As a result, when the voltage of the negative signal NEG is higher than the voltage of the positive signal POS, the output signal LATE_CLK becomes high level, and when the voltage of the negative signal NEG is lower than the voltage of the positive signal POS, the output signal LATE_CLK becomes low level.

To the non-inverted input terminal of the clock generating unit A3, a positive signal POS is input, and to the inverted input terminal of the clock generating unit A3, a negative signal NEG is input. As a result, when the voltage of the positive signal POS is higher than the voltage of the negative signal NEG, the output signal EARLY_CLK becomes high level, and when the voltage of the positive signal POS is lower than the voltage of the negative signal NEG, the output signal EARLY_CLK becomes low level.

Figure 14:
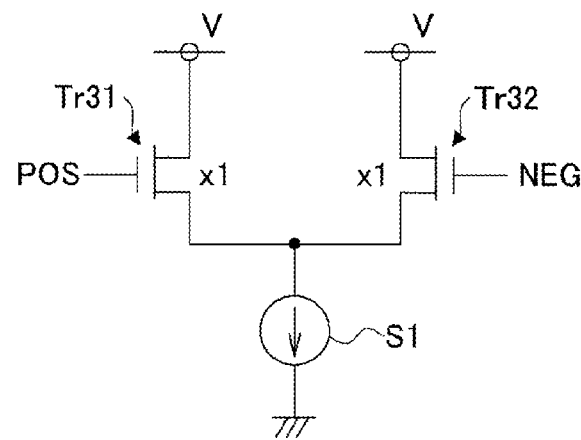
FIG. 14 is a circuit diagram for describing a configuration of a clock generating unit illustrated in FIG. 13 (part 1).

FIG. 14 illustrates a circuit example of a differential input unit of a differential amplifier applicable to the clock generating units A2, A3. In the circuit of FIG. 14, the sources of n-MOS (n-Metal Oxide Semiconductor) transistors Tr31, Tr32 are connected to a power source V, and the drains of the n-MOS transistors Tr31, Tr32 are connected to ground potential via a current source S1. To the gates of the transistors Tr31, Tr32, a positive signal POS and a negative signal NEG are applied, respectively. In the circuit of FIG. 14, the on-resistance decreases and the drain-source current increases in the transistor applied with the signal with the higher voltage between the positive signal POS and the negative signal NEG, and the on-resistance increases and the drain-source current decreases in the other transistor.

Figure 15:
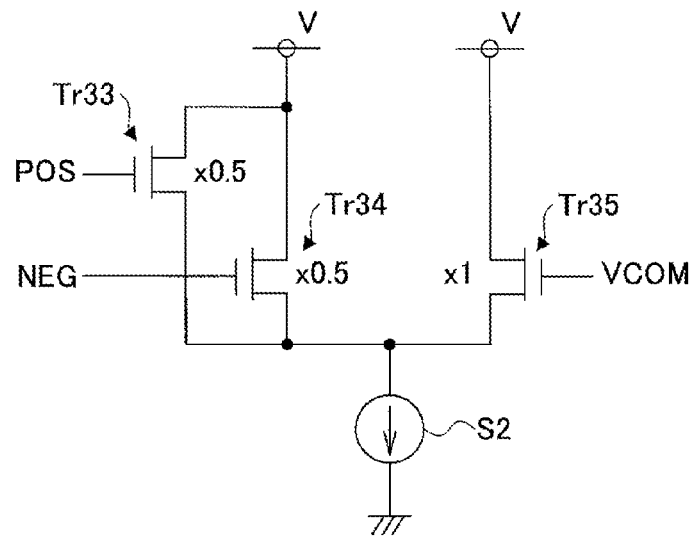
FIG. 15 is a circuit diagram for describing a configuration of a detecting unit illustrated in FIG. 13 (part 1).

FIG. 15 illustrates a circuit example of a differential input unit of a differential amplifier applicable to the detecting unit A1. In the circuit of FIG. 15, n-MOS transistors Tr33, Tr34 are connected in parallel. The sources of the parallel circuits and a n-MOS transistor Tr35 are connected to a power source V, and the drains of the parallel circuits and the n-MOS transistor Tr35 are connected to ground potential via a current source S2. To the gates of the n-MOS transistors Tr33, Tr34, a positive signal POS and a negative signal NEG are applied, respectively. To the gate of the n-MOS transistor Tr35, a center voltage VCOM of the positive signal POS and the negative signal NEG is applied.

In the circuit of FIG. 15, the size ratio of the transistors Tr33, Tr34 of the parallel circuit is half (=0.5) that of the transistor Tr35. The size ratio of the transistor means W/L. W means the gate width and L means the gate length. In the circuit of FIG. 15, the combined resistance of the on-resistance of the transistor Tr33 determined by a positive signal POS and an on-resistance of the transistor Tr34 determined by a negative signal NEG, is compared with the on-resistance of the transistor Tr35 determined by a center voltage VCOM. As a result of the comparison, the drain-source current of the lower resistance is increased, and the drain-source current of the higher resistance is decreased. The above comparison is a comparison of on-resistances determined by a square-root law of the transistor, that is to say, a comparison of $1/(1/POS^2+1/NEG^2)$ and $(VCOM^2)/2$ (the same applies hereinafter).

Figure 16A:
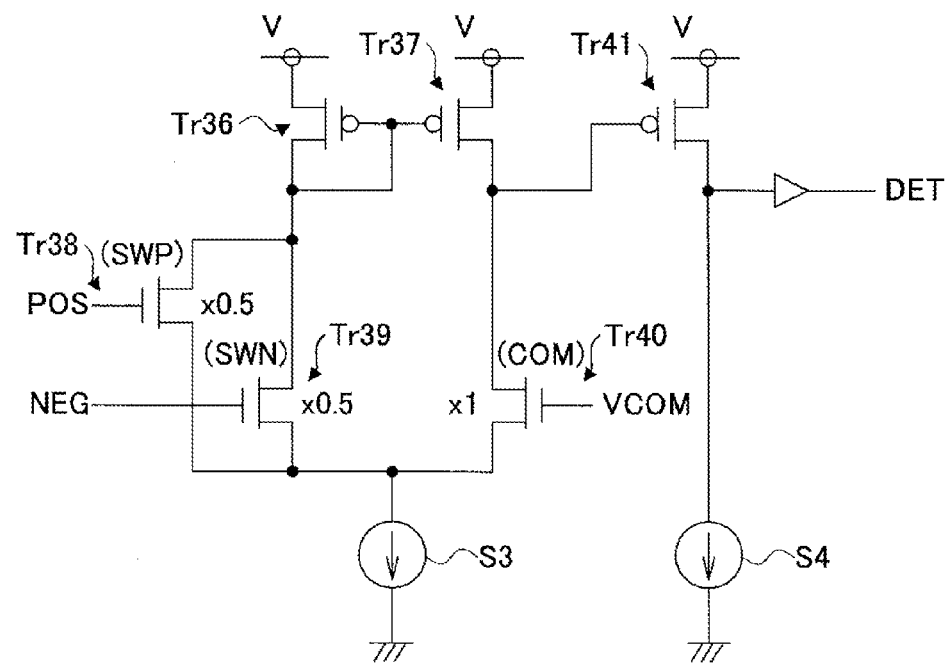
FIG. 16A is a circuit diagram for describing a configuration of a detecting unit illustrated in FIG. 13 (part 2).
Figure 16B:
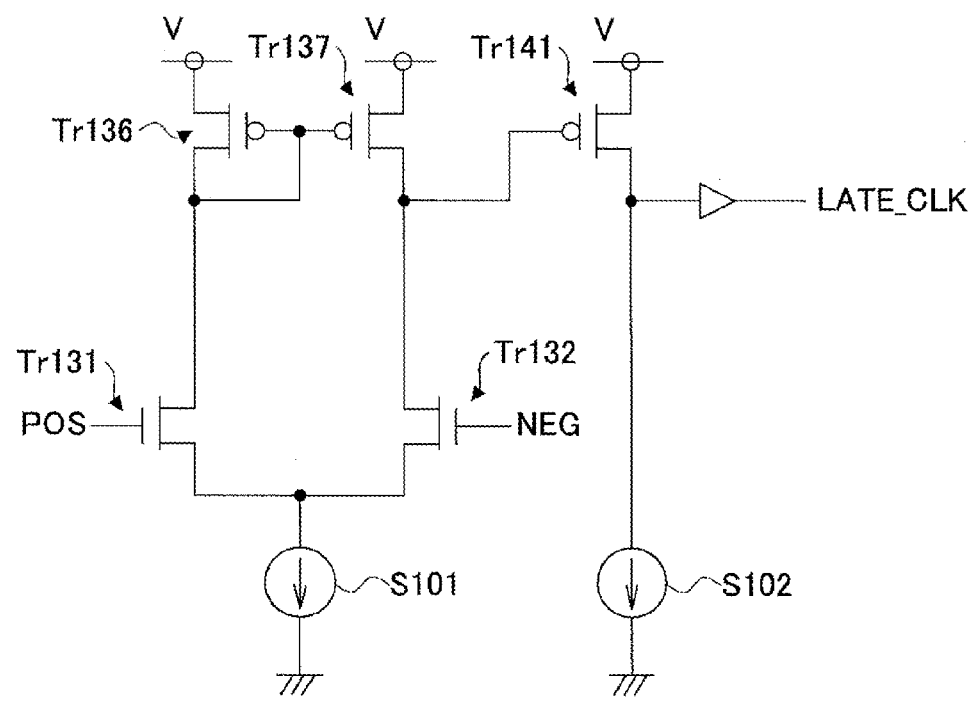
FIG. 16B is a circuit diagram for describing a configuration of a clock generating unit illustrated in FIG. 13 (part 2).
Figure 16C:
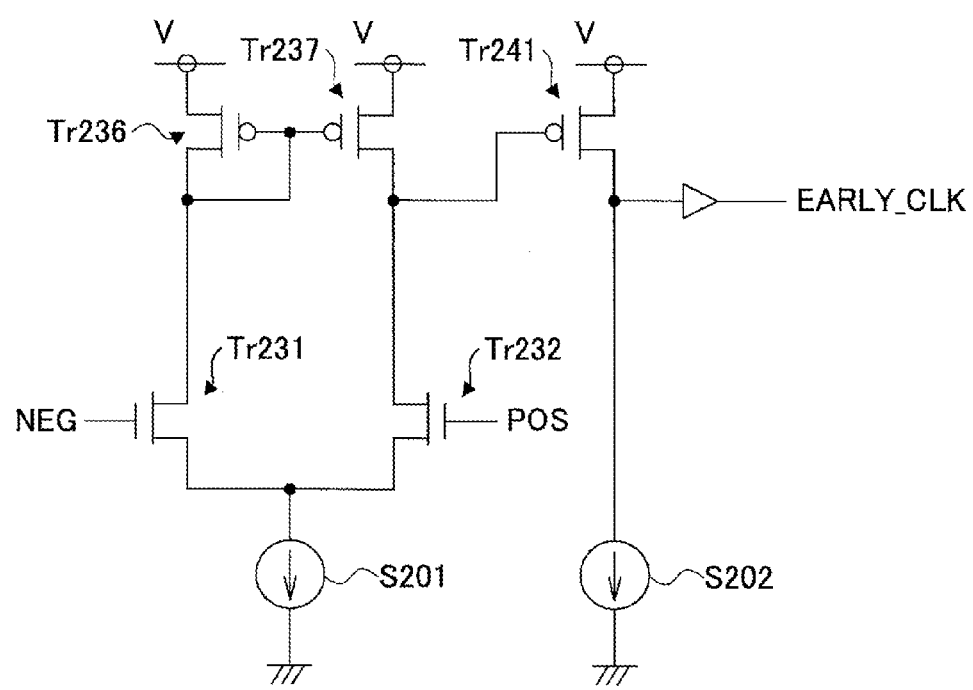
FIG. 16C is a circuit diagram for describing a configuration of a clock generating unit illustrated in FIG. 13 (part 3).

FIGS. 16A, 16B, and 16C respectively illustrate circuit examples of the detecting unit A1 and the clock generating units A2 and A3 of FIG. 13.

The detecting unit A1 illustrated in FIG. 16A has a format of a differential amplifier circuit. Here, a circuit including transistors Tr38, Tr39, and Tr40 corresponding to the differential input unit (Tr33, Tr34, and Tr35) described above with reference to FIG. 15 and a current source S3, is applied as a differential input unit. Furthermore, between a parallel circuit including the transistors Tr38, Tr39 and the transistor Tr40 and a power source V, a current mirror circuit of the p-MOS (p-Metal Oxide Semiconductor) transistors Tr36, Tr37 is inserted. Furthermore, a p-MOS transistor Tr41 is provided, whose gate is connected to the drain of the transistor Tr40. The p-MOS transistor Tr41 is connected in series with a current source S4. An amplifier unit of the detecting unit A1 is formed as above.

In the detecting unit A1 illustrated in FIG. 16A, the combined resistance of the on-resistance of the transistor Tr38 determined by a positive signal POS and an on-resistance of the transistor Tr39 determined by a negative signal NEG, is compared with the on-resistance of the transistor Tr40 determined by a center voltage VCOM. As a result of the comparison, the drain-source current of the lower resistance is increased, and the drain-source current of the higher resistance is decreased. For example, when the positive signal POS and the negative signal NEG are lower than the center voltage VCOM, the on-resistance of the transistor Tr40 determined by the center voltage VCOM is lower than the combined resistance of the on-resistance of the transistor Tr38 determined by a positive signal POS and an on-resistance of the transistor Tr39 determined by a negative signal NEG. When the on-resistance of the transistor Tr40 determined by the center voltage VCOM is lower than the combined resistance of the on-resistance of the transistor Tr38 determined by a positive signal POS and an on-resistance of the transistor Tr39 determined by a negative signal NEG, the drain-source current of the transistors Tr38, Tr39 is decreased, and the drain-source current of the transistor Tr40 is increased. As a result, the drain voltage of the transistor Tr40 that is the output voltage of the differential input unit is decreased. As a result, the on-resistance of the transistor Tr41 of the amplifier unit is decreased, and as a result the output voltage DET increases. Therefore, the output DET becomes high level. As described above, in the detecting unit A1 of FIG. 16A, in a case where, for example, the positive signal POS and the negative signal NEG are lower than the center voltage VCOM, the on-resistance of the Tr40 determined by the center voltage VCOM is lower than the combined resistance of the on-resistance of the transistor Tr38 determined by a positive signal POS and an on-resistance of the transistor Tr39 determined by a negative signal NEG, and the output signal DET becomes high level.

In contrast, for example, in a case where the positive signal POS and the negative signal NEG are higher than the center voltage VCOM, the on-resistance of the Tr40 determined by the center voltage VCOM is higher than the combined resistance of the on-resistance of the transistor Tr38 determined by a positive signal POS and an on-resistance of the transistor Tr39 determined by a negative signal NEG. When the on-resistance of the Tr40 determined by the center voltage VCOM is higher than the combined resistance of the on-resistance of the transistor Tr38 determined by a positive signal POS and an on-resistance of the transistor Tr39 determined by a negative signal NEG, the drain-source current of the transistors Tr38, Tr39 is increased, and the drain-source current of the transistor Tr40 is decreased. As a result, the drain voltage of the transistor Tr40 that is the output voltage of the differential input unit is increased. As a result, the on-resistance of the transistor Tr41 of the amplifier unit is increased, and as a result the output voltage DET decreases. Therefore, the output DET becomes low level. As described above, in the detecting unit A1 of FIG. 16A, in a case where, for example, the positive signal POS and the negative signal NEG are higher than the center voltage VCOM, the on-resistance of the Tr40 determined by the center voltage VCOM is higher than the combined resistance of the on-resistance of the transistor Tr38 determined by a positive signal POS and an on-resistance of the transistor Tr39 determined by a negative signal NEG, and the output signal DET becomes low level.

The clock generating unit A2 illustrated in FIG. 16B and the clock generating unit A3 illustrated in FIG. 16C respectively have a format of a differential amplifier circuit similar to the detecting unit A1 illustrated in FIG. 16A. Furthermore, the clock generating units A2, A3 have the same configuration as the detecting unit A1 illustrated in FIG. 16A, other than the point that the signals that are the targets of being compared to each other in the differential input unit are different. That is to say, as described above, in the detecting unit A1 of FIG. 16A, the combined resistance of the on-resistance of the transistor Tr38 determined by a positive signal POS and an on-resistance of the transistor Tr39 determined by a negative signal NEG, is compared with the on-resistance of the transistor Tr40 determined by a center voltage VCOM. Meanwhile, in the clock generating unit A2, an on-resistance of a transistor Tr131 determined by a positive signal POS is compared with an on-resistance of a transistor Tr132 determined by a negative signal NEG. Furthermore, in the clock generating unit A3, an on-resistance of a transistor Tr231 determined by a negative signal NEG is compared with an on-resistance of a transistor Tr232 determined by a positive signal POS. Meanwhile, A1, A2, and A3 have a common circuit configuration otherwise. The reason for this is to prevent a property difference (mutual delay) from occurring between the detecting unit A1 and the clock generating units A2, A3 in the differential signal skew detection circuit of FIG. 13.

In the clock generating unit A2 illustrated in FIG. 16B, a circuit including transistors Tr131, Tr132 corresponding to the differential input unit (Tr31, Tr32) described above with reference to FIG. 14 and a current source S101, is applied as a differential input unit. Furthermore, between the transistors Tr131, Tr132 and the power source, a current mirror circuit of the p-MOS (p-Metal Oxide Semiconductor) transistors Tr136, Tr137 is inserted. Furthermore, a p-MOS transistor Tr141 is provided, whose gate is connected to the drain of the transistor Tr132. The p-MOS transistor Tr141 is connected in series with a current source S102. An amplifier unit of the clock generating unit A2 is formed as above.

In the clock generating unit A2 illustrated in FIG. 16B, when a voltage of a positive signal POS is lower than a voltage of a negative signal NEG, the on-resistance of the transistor Tr131 is increased and the drain-source current of the transistor Tr131 decreases, and conversely the on-resistance of the transistor Tr132 is decreased and the drain-source current of the transistor Tr132 increases. As a result, the drain voltage of the transistor Tr132 that is the output voltage of the differential input unit decreases, and as a result the on-resistance of the transistor Tr141 of the amplifier unit decreases. As a result, the output voltage LATE_CLK increases. Therefore, the output LATE_CLK becomes high level. As described above, in the clock generating unit A2 illustrated in FIG. 16B, when the negative signal NEG is higher than the voltage of the positive signal POS, the output signal LATE_CLK becomes high level.

Conversely, when a voltage of a positive signal POS is higher than a voltage of a negative signal NEG, the on-resistance of the transistor Tr131 is decreased and the drain-source current of the transistor Tr131 increases, and conversely the on-resistance of the transistor Tr132 is increased and the drain-source current of the transistor Tr132 decreases. As a result, the drain voltage of the transistor Tr132 that is the output voltage of the differential input unit increases, and as a result the on-resistance of the transistor Tr141 of the amplifier unit increases. As a result, the output voltage LATE_CLK decreases. Therefore, the output LATE_CLK becomes low level. As described above, in the clock generating unit A2 illustrated in FIG. 16B, when the negative signal NEG is lower than the voltage of the positive signal POS, the output signal LATE_CLK becomes low level.

Meanwhile, in the clock generating unit A3 illustrated in FIG. 16C, a circuit including transistors Tr231, Tr232 corresponding to the differential input unit described above with reference to FIG. 14 and a current source S201, is applied as a differential input unit. However, unlike the clock generating unit A2, in the clock generating unit A3, a negative signal NEG is applied to the gate of the transistor Tr231, and a positive signal NEG is applied to the gate of the transistor 232. Furthermore, between the transistors Tr231, Tr232 and the power source, a current mirror circuit of the p-MOS transistors Tr236, Tr237 is inserted. Furthermore, a p-MOS transistor Tr241 is provided, whose gate is connected to the drain of the transistor Tr232. The p-MOS transistor Tr241 is connected in series with a current source S202. An amplifier unit of the clock generating unit A3 is formed as above.

In the clock generating unit A3 illustrated in FIG. 16C, when a negative signal NEG is lower than a positive signal POS, the on-resistance of the transistor Tr231 is increased and the drain-source current of the transistor Tr231 decreases, and conversely the on-resistance of the transistor Tr232 is decreased and the drain-source current of the transistor Tr232 increases. As a result, the drain voltage of the transistor Tr232 that is the output voltage of the differential input unit decreases, and as a result the on-resistance of the transistor Tr241 of the amplifier unit decreases. As a result, the output voltage EARLY_CLK increases. Therefore, the output EARLY_CLK becomes high level. As described above, in the clock generating unit A3 illustrated in FIG. 16C, when the voltage of the positive signal POS is higher than the voltage of the negative signal NEG, the output signal EARLY_CLK becomes high level.

Conversely, when a voltage of a negative signal NEG is higher than a voltage of a positive signal POS, the on-resistance of the transistor Tr231 is decreased and the drain-source current of the transistor Tr231 increases, and conversely the on-resistance of the transistor Tr232 is increased and the drain-source current of the transistor Tr232 decreases. As a result, the drain voltage of the transistor Tr232 that is the output voltage of the differential input unit increases, and as a result the on-resistance of the transistor Tr241 of the amplifier unit increases. As a result, the output voltage EARLY_CLK decreases. Therefore, the output EARLY_CLK becomes low level. As described above, in the clock generating unit A3 illustrated in FIG. 16C, when the positive signal POS is lower than the negative signal NEG, the output signal EARLY_CLK becomes low level.

Figure 17:
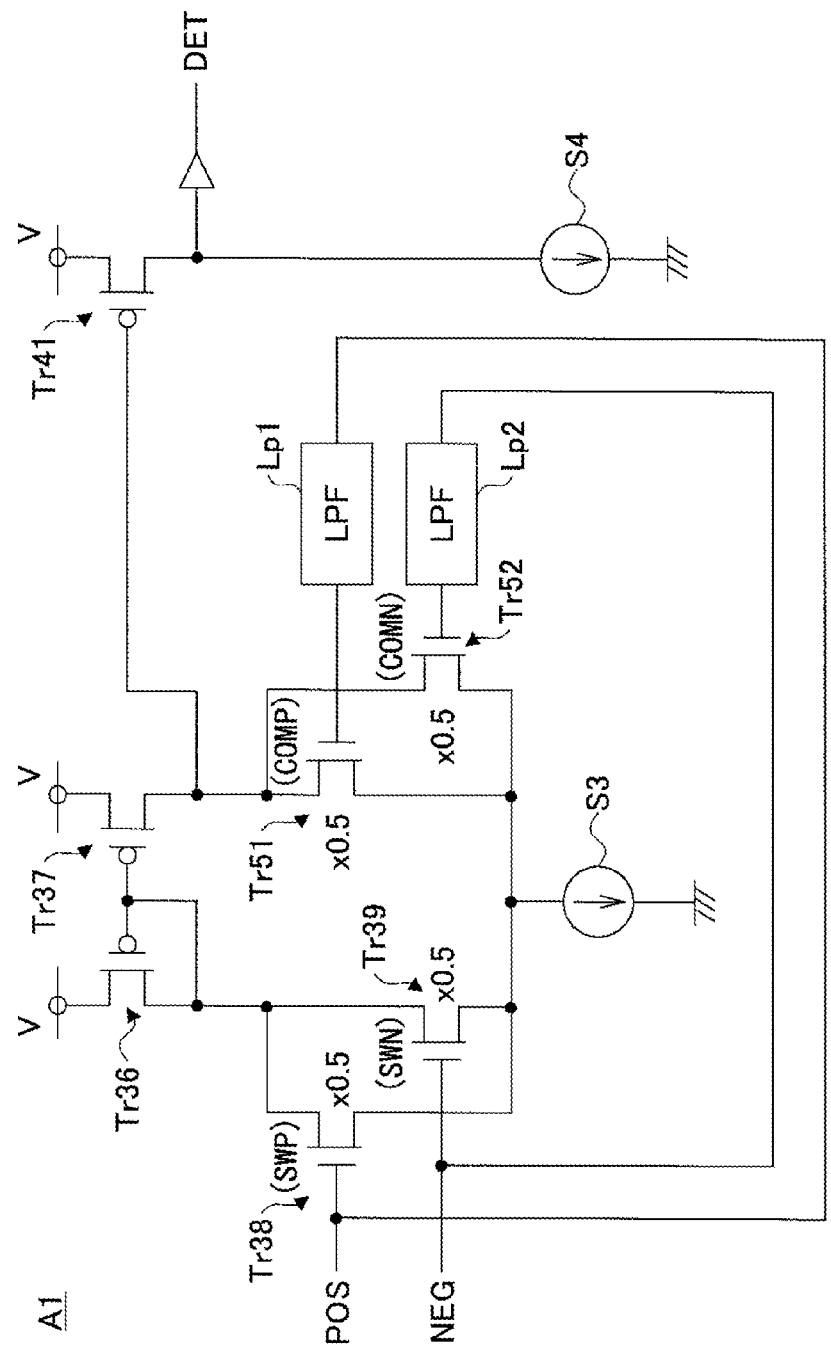
FIG. 17 is a circuit diagram of a modification of the configuration example of the detecting unit illustrated in FIG. 16A.

FIG. 17 illustrates a modification of the circuit configuration of the detecting unit A1 illustrated in FIG. 16A. The modification of FIG. 17 is a circuit configuration example of the detecting unit A1 in a case where it is not possible to prepare a center voltage VCOM. In the case of FIG. 17, low-pass filters Lp1, Lp2 are used to generate center voltages of the positive signal POS and the negative signal NEG of the differential signals.

In the circuit configuration of FIG. 17, elements corresponding to those of the circuit configuration of FIG. 16A are denoted by the same reference numerals and overlapping descriptions are omitted. In the circuit configuration of FIG. 17, instead of the transistor Tr40 in FIG. 16A, a parallel circuit including n-MOS transistors Tr51, Tr52 having the same transistor size ratio as the n-MOS transistors Tr38, Tr39 is provided. To the gate of the transistor Tr51, a signal obtained by passing a positive signal POS through the low-pass filter Lp1 is applied, and to the gate of the transistor Tr52, a signal obtained by passing a negative signal NEG through the low-pass filter Lp1 is applied In the circuit of FIG. 17, the combined resistance of the on-resistances of the transistors Tr38, Tr39 determined by the voltages applied to the respective gates of the transistors Tr38, Tr39, and the combined resistance of the on-resistances of the transistors Tr51, Tr52 determined by the voltages applied to the respective gates of the transistors Tr51, Tr52, are compared with each other. Here, the voltages applied to the gates of the transistors Tr51, Tr52 are a voltage obtained by passing a positive signal POS through the low-pass filter Lp1 and a voltage obtained by passing a negative signal NEG through the low-pass filter Lp1, respectively. Therefore, in the case of the circuit of FIG. 17, according to the same operation principle as the circuit of FIG. 16A, for example, when the positive signal POS and the negative signal NEG are lower than the center voltage VCOM, and when the combined resistance of the on-resistances of the transistors Tr51, Tr52 determined by the voltages applied to the respective gates of the transistors Tr51, Tr52 is lower than the combined resistance of the on-resistances of the transistors Tr38, Tr39 determined by the voltages applied to the respective gates of the transistors Tr38, Tr39, the output voltage DET becomes high level. Conversely, for example, when the positive signal POS and the negative signal NEG are higher than the center voltage VCOM, the combined resistance of the on-resistances of the transistors Tr51, Tr52 determined by the voltages applied to the respective gates of the transistors Tr51, Tr52 is higher than the combined resistance of the on-resistances of the transistors Tr38, Tr39 determined by the voltages applied to the respective gates of the transistors Tr38, Tr39, and the output voltage DET becomes low level. Therefore, the circuit of FIG. 17 has the same function as the detecting unit A1 having the circuit configuration of FIG. 16A.

Figure 18:
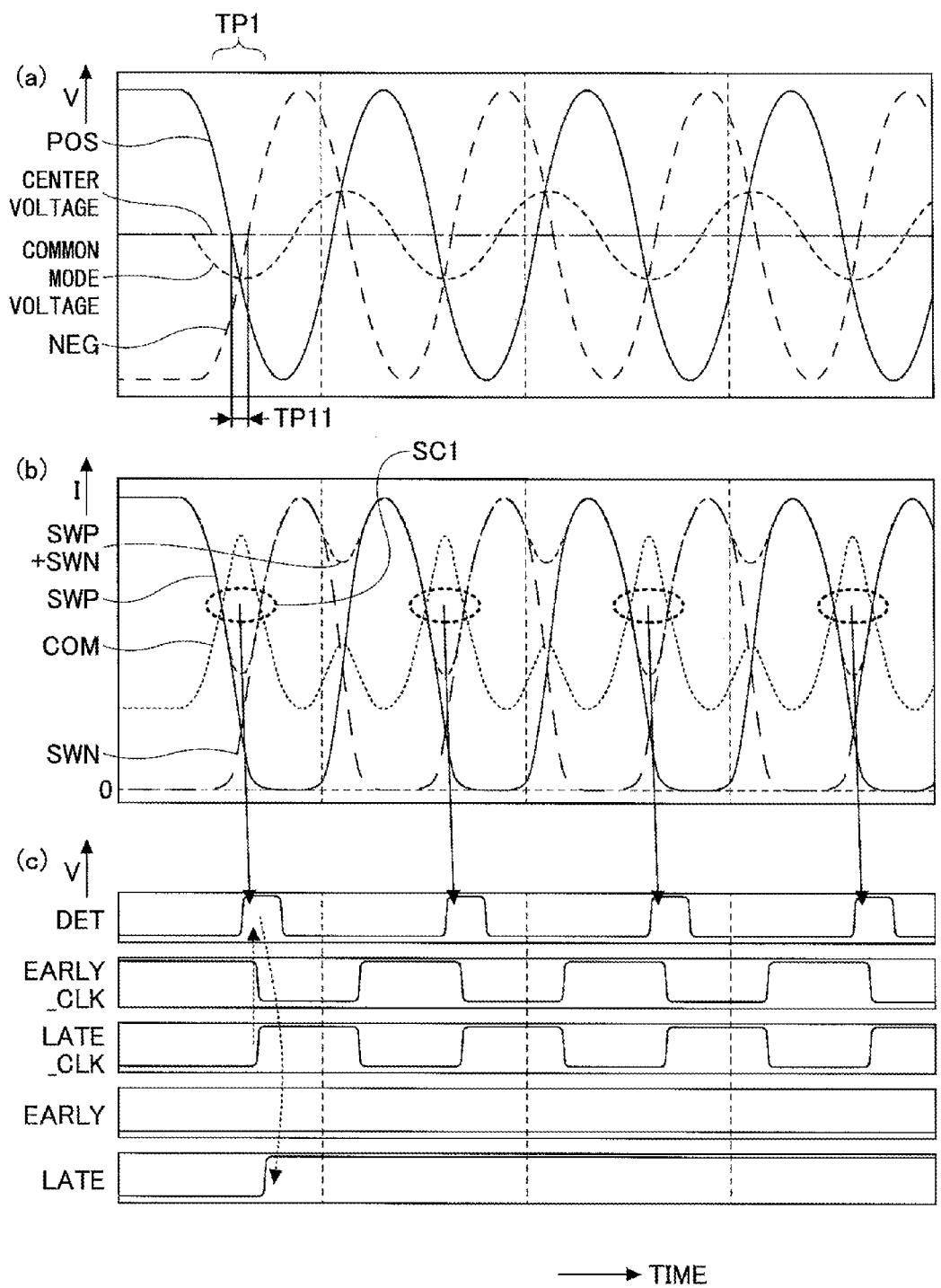
FIG. 18 is a waveform diagram for describing an example of a differential signal skew detection operation by the differential signal skew detection circuit illustrated in FIG. 13 (a case where the negative signal is later).
Figure 19:
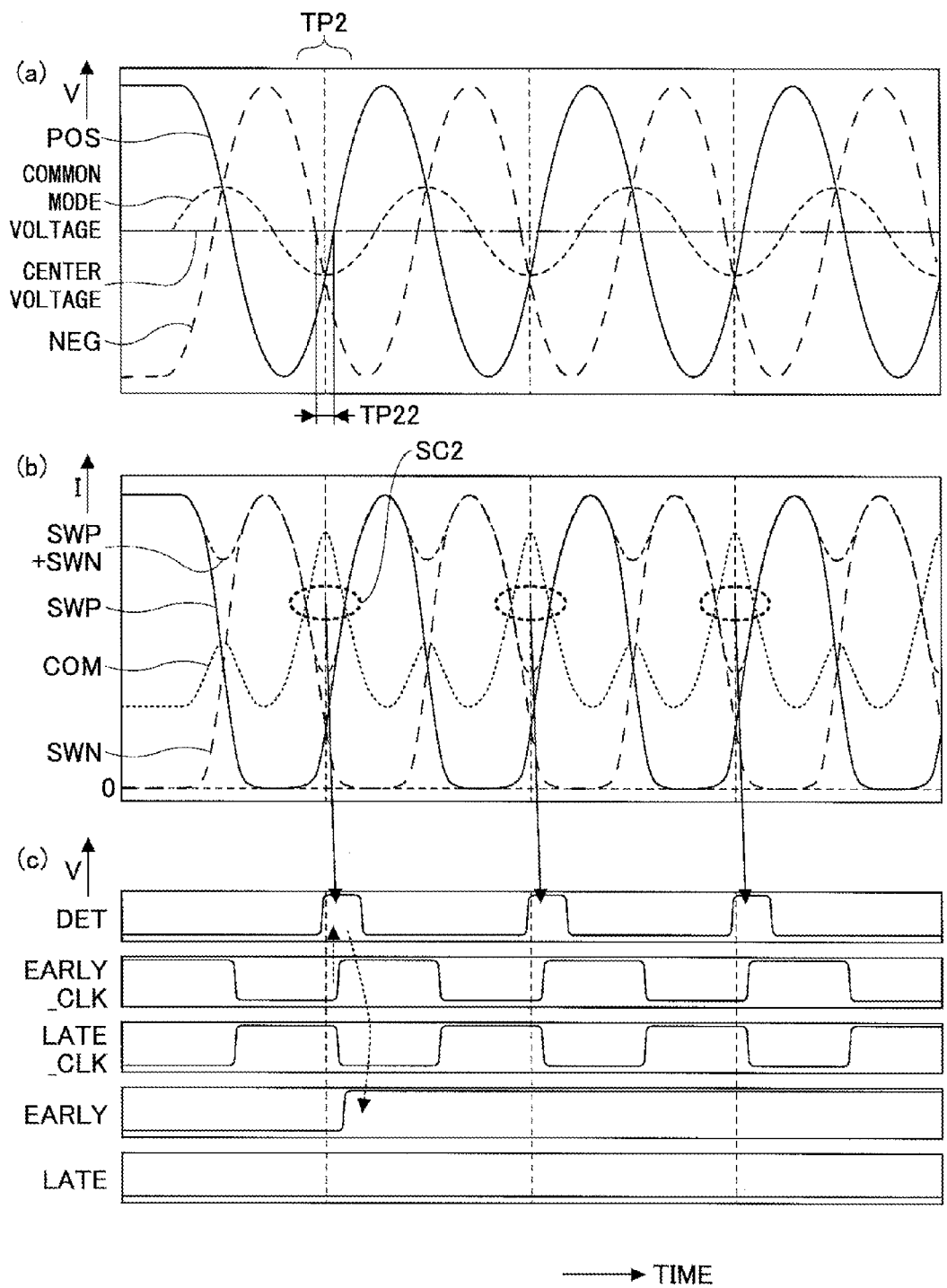
FIG. 19 is a waveform diagram for describing an example of a differential signal skew detection operation by the differential signal skew detection circuit illustrated in FIG. 13 (a case where the negative signal is earlier).

Next, with reference to FIGS. 18 and 19, a description is given of an example of an operation of a differential signal skew detection circuit having the configurations described above with reference to FIGS. 13 through 17.

FIG. 18 illustrates a case where the negative signal NEG is later than the positive signal POS. FIG. 18 (a) illustrates waveforms of a positive signal POS and a negative signal NEG input to the differential signal skew detection circuit. FIG. 18 (b) illustrates waveforms of a drain current SWP of the transistor Tr38, a drain current SWN of the transistor Tr39, a sum of both of these currents SWP+SWN, and a drain current COM of the transistor Tr40, in the circuit example of FIG. 16A. The waveforms of the drain currents with respect to the voltage waveforms applied to the gates of the transistors are assumed to comply with the square-root law of the transistors. FIG. 18 (c) illustrates the voltage waveforms of the signals DET, EARLY_CLK, LATE_CLK, EARLY, and LATE in the differential signal skew detection circuit illustrated in FIG. 13.

As illustrated in FIG. 18 (a), when the negative signal NEG is later than the positive signal POS, during a period TP1 in which the positive signal POS falls and the negative signal NEG rises, there is a time period TP11 in which both signals of the positive signal POS and the negative signal NEG are lower than the center voltage VCOM. During the time period TP11 in which the positive signal and the negative signal are lower than the center voltage, a resistance value (combined resistance) of a parallel circuit of on-resistances of the transistors Tr38, Tr39 that receive POS, NEG signals at their gates, becomes larger than the resistance value of an on-resistance of the transistor Tr40 that receives a center voltage VCOM at its gate. As a result, as indicated at SC1 in FIG. 18 (b), in the differential input unit (Tr38, Tr39, Tr40) of the detecting unit A1 in FIG. 16A, the current COM flowing through the transistor Tr40 having the lower resistance value increases. Meanwhile, the current SWP+SWN flowing through the parallel circuit (Tr38, Tr39) having the higher resistance value decreases. As a result, in the time period TP11, almost all of the current flowing to the differential input unit flows to the transistor Tr40 having the lower resistance value to which the current COM flows. As a result, the drain voltage of the transistor Tr40 that is an output voltage to the amplifier unit (Tr41) decreases, and as a result the signal DET that is output of the amplifier unit becomes high level (FIG. 18 (c), DET).

Furthermore, during the time period when the output DET of the detecting unit A1 of the differential signal skew detection circuit of FIG. 13 becomes high level, the positive signal POS falls and the negative signal NEG rises. As a result, the comparative relationship between the positive signal POS and the negative signal NEG is reversed at some point from a state where the positive signal POS is greater to a state where the negative signal NEG is greater. At the time point when the negative signal NEG becomes greater, the output of the clock generating unit A2 (FIG. 18 (c), LATE_CLK) changes from low level to high level. At the same timing, the output of the clock generating unit A3 (FIG. 18 (c), EARLY_CLK) changes from high level to low level. Therefore, only the flip flop FF1 in which the voltage (LATE_CLK) applied to the clock input terminal rises, takes in the high level DET signal. Meanwhile, the flip flop FF2 in which the voltage (EARLY_CLK) applied to the clock input terminal falls, does not take in the value of the DET signal. Therefore, the LATE signal (in FIG. 18 (c), LATE) that is output of the flip flop FF1 becomes high level.

At the timing at which the signal EARLY_CLK (in FIG. 18 (c), EARLY_CLK) applied to the clock input terminal of the flip flop FF2 rises, that is to say, at the timing when the positive signal POS that rises becomes greater than NEG that falls, the DET signal (in FIG. 18 (c), DET) is low level. Therefore, at this timing, the flip flop FF2 does not take in the DET signal. Therefore, in the case of FIG. 18 (c), the output EARLY of the differential signal skew detection circuit becomes low level. Meanwhile, during this period, LATE_CLK is low level and FF1 does not take in the DET signal. Therefore, the LATE signal maintains high level.

FIG. 19 illustrates a case where the negative signal NEG is earlier than the positive signal POS. FIG. 19 (a) illustrates waveforms of a positive signal POS and a negative signal NEG input to the differential signal skew detection circuits 14, 24. FIG. 19 (b) illustrates waveforms of a drain current SWP of the transistor Tr38, a drain current SWN of the transistor Tr39, a sum of both of these currents SWP+SWN, and a drain current COM of the transistor Tr40, in the circuit example of FIG. 16A. The waveforms of the drain currents with respect to the voltage waveforms applied to the gates of the transistors are assumed to comply with the square-root law of the transistors. FIG. 19 (c) illustrates the voltage waveforms of the signals DET, EARLY_CLK, LATE_CLK, EARLY, and LATE in the differential signal skew detection circuits 14, 24 illustrated in FIG. 13.

As illustrated in FIG. 19 (a), when the negative signal NEG is earlier than the positive signal POS, during a period TP2 in which the positive signal POS rises and the negative signal NEG falls, there is a time period TP22 in which both signals of the positive signal POS and the negative signal NEG are lower than the center voltage VCOM. During the time period TP22 in which the positive signal and the negative signal are lower than the center voltage, a resistance value of a parallel circuit of on-resistances of the transistors Tr38, Tr39 that receive POS, NEG signals at their gates, becomes larger than the resistance value of an on-resistance of the transistor Tr40 that receives a center voltage VCOM at its gate. As a result, as indicated in FIG. 19 (b) (horizontally long ellipse part SC2 indicated in dashed lines), in the differential input unit (Tr38, Tr39, Tr40) of the detecting unit A1 in FIG. 16A, the current COM flowing through the transistor Tr40 having the lower resistance value increases. Meanwhile, the current SWP+SWN flowing through the parallel circuit (Tr38, Tr39) having the higher resistance value decreases. As a result, in the time period TP22, almost all of the current flowing to the differential input unit flows to the transistor Tr40 having the lower resistance value to which the current COM flows. As a result, the drain voltage of the transistor Tr40 that is an output voltage to the amplifier unit (Tr41) decreases, and as a result the signal DET that is output of the amplifier unit becomes high level (FIG. 19 (c), DET).

During the time period when the output DET of the detecting unit A1 of the differential signal skew detection circuit of FIG. 13 becomes high level, the positive signal POS rises and the negative signal NEG falls. As a result, the comparative relationship between the positive signal POS and the negative signal NEG is reversed at some point from a state where the negative signal NEG is greater to a state where the positive signal POS is greater. At the time point when the negative signal POS becomes greater, the output of the clock generating unit A3 (FIG. 19 (c), EARLY_CLK) changes from low level to high level. At the same timing, the output of the clock generating unit A2 (FIG. 19 (c), LATE_CLK) changes from high level to low level. Therefore, only the flip flop FF2 in which the voltage (EARLY_CLK) applied to the clock input terminal rises, takes in the high level DET signal. Meanwhile, the flip flop FF1 in which the voltage (LATE_CLK) applied to the clock input terminal falls, does not take in the value of the DET signal. Therefore, the EARLY signal (in FIG. 19 (c), EARLY) that is output of the flip flop FF2 becomes high level.

At the timing at which the signal LATE_CLK (in FIG. 19 (c), LATE_CLK) applied to the clock input terminal of the flip flop FF1 rises, that is to say, at the timing when the positive signal POS that falls becomes greater than NEG that rises, the DET signal (in FIG. 19 (c), DET) is low level. Therefore, at this timing, the flip flop FF1 does not take in the DET signal. Therefore, in the case of FIG. 19 (c), the output EARLY of the differential signal skew detection circuit becomes high level. Meanwhile, during this period, EARLY_CLK is low level and FF2 does not take in the DET signal. Therefore, the EARLY signal maintains high level.

As described above, in the case of FIG. 18, that is to say, when the negative signal NEG is later, in the differential signal skew detection circuit, the output LATE becomes high level and the output EARLY becomes low level. Meanwhile, in the case of FIG. 19, that is to say, when the negative signal NEG is earlier, the output EARLY becomes high level and the output LATE becomes low level in the differential signal skew detection circuit. The state machines 15, 25 in the transmission/reception device of FIGS. 5 and 10 are reported of the direction of the differential signal skew by receiving output of the differential signal skew detection circuit.

Figure 20:
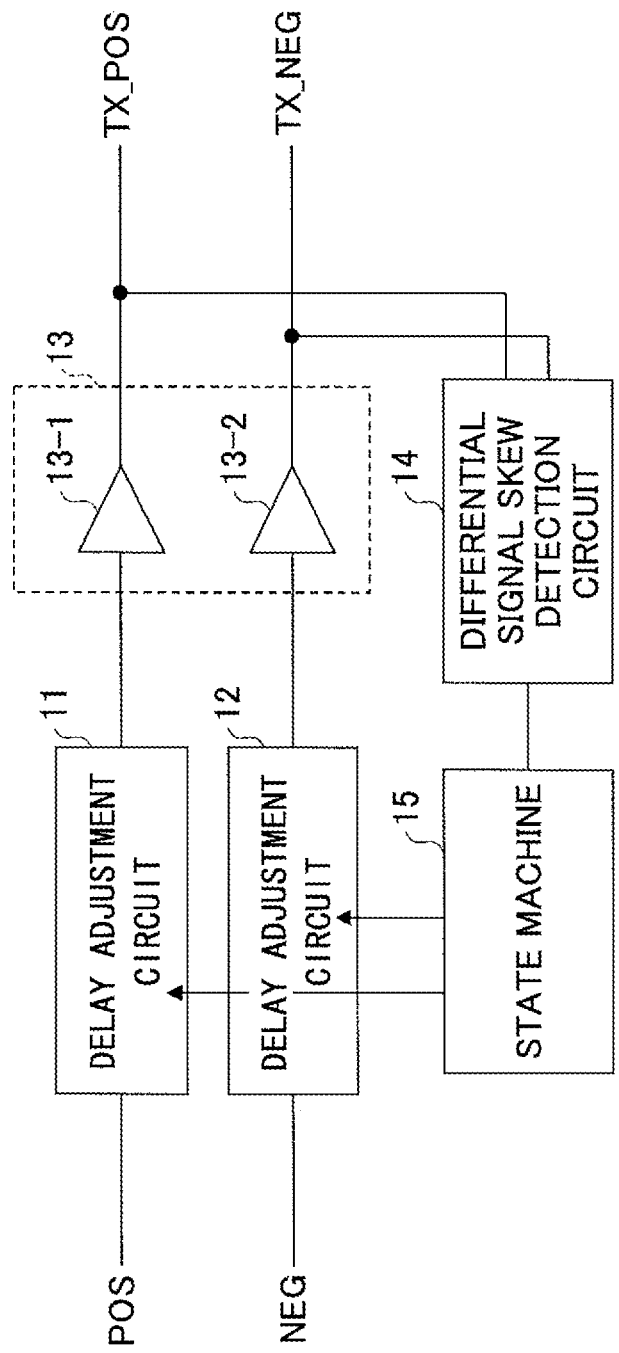
FIG. 20 is a circuit diagram illustrating a circuit example of a transmission circuit, for describing an example of a differential signal skew correction method at the sending side according to an embodiment.
Figure 21:
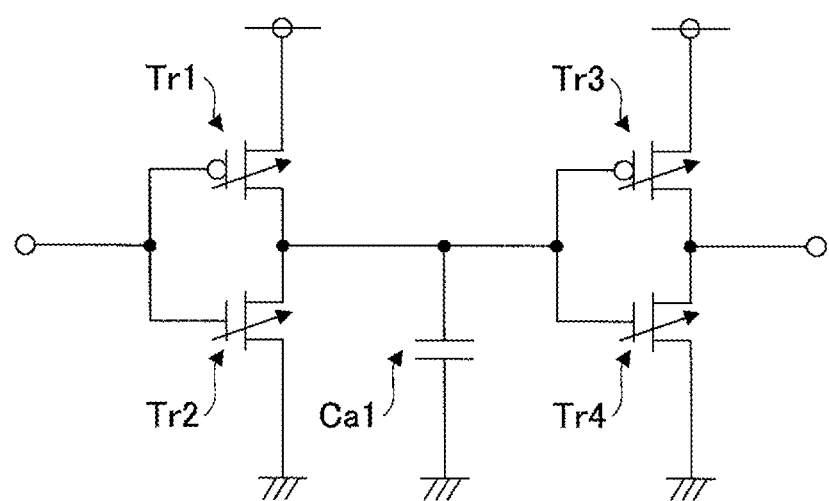
FIG. 21 is a circuit diagram for describing a configuration example of a delay adjustment circuit illustrated in FIG. 20 (part 1).
Figure 22:
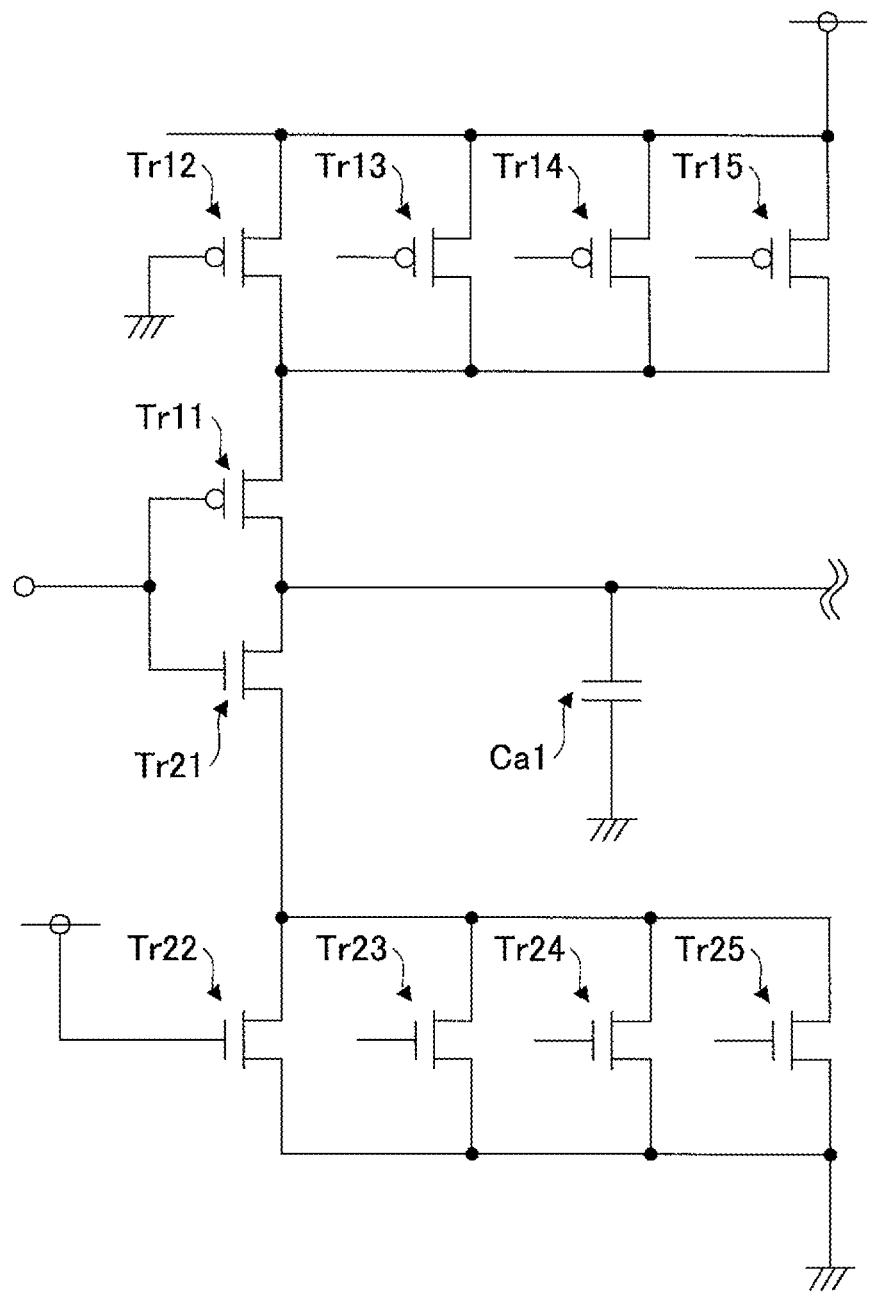
FIG. 22 is a circuit diagram for describing a configuration example of a delay adjustment circuit illustrated in FIG. 20 (part 2).

Next, a description of configuration examples of the delay adjustment circuits 11, 12 in the transmission circuits 10, 10A is given with reference to FIGS. 20, 21, and 22. Typical circuit formats of a driver of a differential transmission method are circuit formats referred to as CML (Current Mode Logic) or LVDS (Low Voltage Differential Signaling). However, for the driver circuit 13 of the first embodiment (transmission circuit 10) and the second embodiment (transmission circuit 10A) of the present invention, a circuit format referred to as VML (Voltage Mode Logic) or CG (Common Gate) is used. According to the circuit format of VML or CG, it is possible to separately control the output timings of a positive signal POS and a negative signal NEG of the differential signals.

As illustrated in FIG. 20, in the transmission circuit 10 of the first embodiment or the transmission circuit 10A of the second embodiment, for data signals POS (positive signal) and NEG (negative signal) input to the driver circuit 13 having the above circuit format, the delay adjustment circuits 11, 12, respectively, are provided. In the delay adjustment circuits 11, 12, by appropriately applying delay to the data signals POS, NEG, the differential signal skew is corrected.

FIGS. 21 and 22 illustrate circuit examples applicable to the delay adjustment circuits 11, 12. The circuit of FIG. 21 has a format of two stages of CMOS (Complementary Metal Oxide Semiconductor) inverter circuits including a p-MOS transistor Tr1, an n-MOS transistor Tr2, a p-MOS transistor Tr3, and an n-MOS transistor Tr4. Between the two stages of CMOS inverter circuits, a capacitive element (capacitor) Ca1 having one end connected to ground is provided. Furthermore, the transistors Tr1, Tr2, Tr3, and Tr4 included in the respective CMOS inverter circuits have a configuration in which the on-resistance is adjustable from outside.

In the configuration of FIG. 21, when a low-level input signal is applied to the CMOS inverter circuit (Tr1, Tr2) of the first stage, the CMOS inverter circuit of the first stage is driven by input signals so as to output high level. As a result, the CMOS inverter circuit of the first stage charges the capacitative element Ca1. As a result of the charging, when the voltage of the capacitative element Ca1 increases to a voltage that is sufficient for driving the CMOS inverter circuit (Tr3, Tr4) of the second stage, the CMOS inverter circuit of the second stage is driven, and the CMOS inverter circuit of the second stage outputs low level signals. That is to say, in the circuit of FIG. 21, the delay, which is dependent on the time taken to charge the capacitative element Ca1, is applied to the input signal.

Here, for example, by decreasing the on-resistances of the transistors Tr1, Tr2, Tr3, and Tr4, the current used for charging the capacitative element Ca1 may be increased and the time taken for the charging may be decreased. Therefore, the delay applied to the signals may be decreased. Meanwhile, by increasing the on-resistances of the transistors Tr1, Tr2, Tr3, and Tr4, the current used for charging the capacitative element Ca1 may be decreased and the time taken for the charging may be increased. Therefore, the delay applied to the signals may be increased.

FIG. 22 illustrates another circuit configuration for the respective CMOS inverter circuits illustrated in FIG. 21. In the case of the circuit configuration of FIG. 22, for example, instead of the transistor Tr1 or Tr3 included in the CMOS inverter circuits of FIG. 21, a series circuit including a parallel circuit constituted by p-MOS transistors Tr12, Tr13, Tr14, and Tr15, and a p-MOS transistor Tr11, is used. Similarly, in the case of the circuit configuration in FIG. 22, for example, instead of the transistor Tr2 or Tr4 included in the CMOS inverter circuits of FIG. 21, a series circuit including a parallel circuit constituted by n-MOS transistors Tr22, Tr23, Tr24, and Tr25, and an n-MOS transistor Tr21, is used. The on-resistance in the series circuit may be increased or decreased by increasing or decreasing the number of transistors to be turned on, among the transistors Tr12, Tr13, Tr14, Tr15 and Tr22, Tr23, Tr24, Tr25 included in the parallel circuits. More specifically, when the number of transistors to be turned on among the parallel transistors is increased, the on-resistance in the series circuit decreases. When the number of transistors to be turned on among the parallel transistors is decreased, the on-resistance in the series circuit increases. As described above, the on-resistance of each of the transistors Tr1, Tr2, Tr3, and Tr4 may be increased or decreased.

Figure 23:
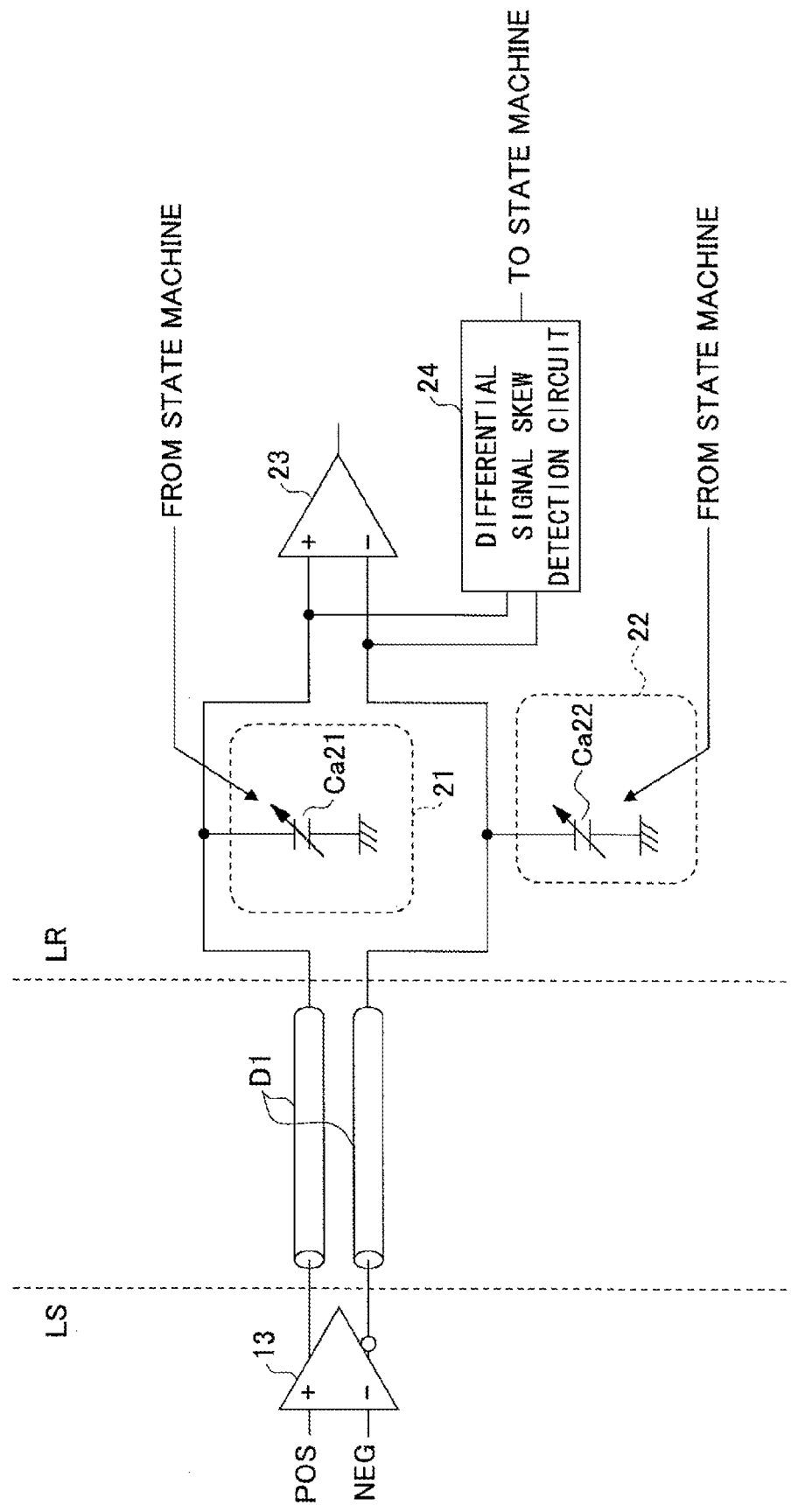
FIG. 23 is a circuit diagram illustrating a circuit example of a reception circuit, for describing an example of a differential signal skew correction method at the receiving side according to an embodiment.

Next, with reference to FIGS. 23 and 24, a description is given of a configuration of a delay adjustment circuit in the reception circuit 20, 20A. As illustrated in FIG. 23, as a delay adjustment circuit, at the former stage of the receiver circuit 23, capacitative elements Ca21, Ca22 are provided, whose capacitative value is variable according instructions from the state machine. According to the configuration of the delay adjustment circuit of FIG. 23, the capacitative value is increased for the capacitative element (Ca21 or Ca22) of the delay adjustment circuit (21 or 22) provided for the signal on which a delay is to be applied between the positive signal POS and the negative signal NEG.

With reference to FIG. 24, a description is given of a function example of the delay adjustment circuit having the configuration of FIG. 23. FIG. 24 (a) illustrates a waveform of an output signal of a transmission circuit and FIG. 24 (b) illustrates a waveform of an input signal of a reception circuit. Furthermore, FIG. 24 (c) illustrates waveforms of signals in the reception circuit after the differential signal skew has been corrected by the delay adjustment circuit.

As illustrated in FIG. 24 (a), it is assumed that the differential signal skew has been corrected in the transmission circuit. Furthermore, in the case of FIG. 24 (b), the negative signal NEG is later than the positive signal POS in the reception circuit. In this case, in order to correct the differential signal skew, the delay is to be applied to the positive signal POS in the reception circuit. Therefore, the state machine 25 implements control to increase the capacitance of the capacitative element Ca21 corresponding to the positive signal POS of the delay adjustment circuit 21. As a result, the waveform of the positive signal becomes obtuse. That is to say, compared to the capacitative element Ca21 before increasing the capacitance in FIG. 24 (b), in the capacitative element Ca21 after increasing the capacitance in FIG. 24 (c), the tilt of the fall of the positive signal POS becomes gradual, and as a result, the timing at which the positive signal POS intersects with the center voltage is delayed (arrow in FIG. 24 (c)). As a result, the differential signal skew Skew is corrected, and as illustrated in FIG. 24 (c), the timing at which the positive signal POS intersects with the center voltage matches the timing at which the negative signal NEG intersects with the center voltage. As described above, the differential signal skew is corrected in the reception circuit, and compared to the case of FIG. 24 (b), in FIG. 24 (c), variation in the common mode voltage is reduced. Therefore, the common mode noise is reduced.

A transmission circuit of a transmission/reception device detects the direction of a differential signal skew of differential signals to be sent, and applies a delay to at least one of a positive signal and a negative signal in a manner as to reduce the differential signal skew. Similarly, the reception circuit of the transmission/reception device detects the direction of a differential signal skew of differential signals that are received, and applies a delay to at least one of a positive signal and a negative signal in a manner as to reduce the differential signal skew. By implementing control at both the sending side and the receiving side to reduce the differential signal skew, the differential signal skew caused when the differential signals are transmitted is effectively reduced.

According to the above detailed descriptions, the characteristics and the advantages of the embodiments are made clear. The scope of the claims may extend to the characteristics and the advantages of the embodiments, without departing from the spirit and the scope of the present invention. Furthermore, those skilled in the art may easily devise modifications and variations, and the scope of the embodiments having inventiveness is not limited to the above, and appropriate modifications and equivalents may be made within the scope of the disclosed embodiments.

All examples and conditional language recited herein are intended for pedagogical purposes to aid the reader in understanding the invention and the concepts contributed by the inventors to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A transmission/reception device comprising:
   a transmission circuit configured to send differential signals to another transmission/reception device; and a reception circuit configured to receive the differential signals from the another transmission/reception device, wherein the transmission circuit includes
- a first delay application unit configured to apply a delay to at least one of a positive signal and a negative signal of the differential signals sent to the another transmission/reception device,
- a first skew detection unit configured to detect a differential signal skew between the positive signal and the negative signal, to at least one of which the delay is applied by the first delay application unit, and
- a first control unit configured to control the first delay application unit in a manner as to reduce the differential signal skew detected by the first skew detection unit, and the reception circuit includes
- a second delay application unit configured to apply a delay to at least one of a positive signal and a negative signal of differential signals sent from the another transmission/reception device,
- a second skew detection unit configured to detect a differential signal skew between the positive signal and the negative signal received from the transmission circuit, to at least one of which the delay is applied by the second delay application unit, and
- a second control unit configured to control the second delay application unit in a manner as to reduce the differential signal skew detected by the second skew detection unit.

2. The transmission/reception device according to claim 1, wherein the first control unit is configured to control the first delay application unit in such a manner as to reduce the differential signal skew detected by the first skew detection unit, and when the differential signal skew detected by the first skew detection unit is determined to be less than or equal to a predetermined value as a result of controlling the first delay application unit, the first control unit sends a differential signal skew correction completion report to the another transmission/reception device.

3. The transmission/reception device according to claim 1, wherein the second control unit is configured to control the second delay application unit in a manner as to reduce the differential signal skew detected by the second skew detection unit, when a differential signal skew correction completion report is received from the another transmission/reception device.

4. The transmission/reception device according to claim 1, wherein
the transmission circuit further includes a first time measurement unit configured to send a first time passage report to the first control unit when a first time passes after activation of an information processing device including the transmission/reception device,
the first control unit is configured to start an operation of controlling the first delay application unit in a manner as to reduce the differential signal skew detected by the first skew detection unit when the first time passage report is received,
the reception circuit further includes a second time measurement unit configured to send a second time passage report to the second control unit when a second time, which is longer than the first time, passes after the activation of the information processing device, and
the second control unit is configured to start an operation of controlling the second delay application unit in a manner as to reduce the differential signal skew detected by the second skew detection unit when the second time passage report is received.

5. The transmission/reception device according to claim 1, wherein each of the first skew detection unit and the second skew detection unit is configured to compare a voltage of the positive signal and a voltage of the negative signal, and when a comparative relationship between the voltage of the positive signal and the voltage of the negative signal is reversed, detect the differential signal skew between the positive signal and the negative signal, by detecting a comparative relationship between a combined resistance of on-resistances of transistors determined by the voltages of the positive signal and the negative signal, and a center voltage of waveforms of the positive signal and the negative signal.

6. The transmission/reception device according to claim 5, wherein
each of the first skew detection unit and the second skew detection unit includes
- a parallel circuit including a first transistor in which the voltage of the positive signal is applied to a control electrode and a second transistor in which the voltage of the negative signal is applied to a control electrode, and
- a third transistor in which the center voltage is applied to a control electrode,
wherein the transmission/reception device includes
- a detection unit in a format of a differential amplifier including output according to a result of a comparison between a combined resistance of on-resistances of the first transistor and the second transistor determined by the respective voltages applied to the control electrodes of the first transistor and the second transistor, and an on-resistance of the third transistor determined by the center voltage applied to the control electrode of the third transistor,
- a first clock generation unit configured to output high-level when the voltage of the negative signal is higher than the voltage of the positive signal,
- a second clock generation unit configured to output high-level when the voltage of the negative signal is lower than the voltage of the positive signal,
- a first hold unit configured to take in the output of the detection unit when the output of the first clock generation unit rises, and
- a second hold unit configured to take in the output of the detection unit when the output of the second clock generation unit rises.

7. An information processing device comprising:
a first delay application unit configured to apply a delay to at least one of a positive signal and a negative signal of differential signals to be sent;
a first skew detection unit configured to detect a differential signal skew between the positive signal and the negative signal;
a first semiconductor integrated circuit including a transmission circuit including a first control unit configured to control the first delay application unit in a manner as to reduce the differential signal skew detected by the first skew detection unit, the first semiconductor integrated circuit being configured to send the differential signals from the transmission circuit to outside;
a second delay application unit configured to apply a delay to at least one of a positive signal and a negative signal of differential signals sent from the first semiconductor integrated circuit;
a second skew detection unit configured to detect a differential signal skew between the positive signal and the negative signal received from the first semiconductor integrated circuit, or between the positive signal and the negative signal to at least one of which the delay is applied by the second delay application unit; and a second semiconductor integrated circuit including a reception circuit including a second control unit configured to control the second delay application unit in a manner as to reduce the differential signal skew detected by the second skew detection unit, the second semiconductor integrated circuit being configured to receive, by the reception circuit, the differential signals sent from the first semiconductor integrated circuit.

8. The information processing device according to claim 7, wherein when the differential signal skew is determined to be less than or equal to a predetermined value, the first control unit sends a differential signal skew correction completion report to the second semiconductor integrated circuit, and when the differential signal skew correction completion report is received from the first semiconductor integrated circuit, the second control unit controls the second delay application unit in a manner as to reduce the differential signal skew.

9. The information processing device according to claim 7, wherein the transmission circuit of the first semiconductor integrated circuit further includes a first time measurement unit, the first time measurement unit being configured to send a first time passage report to the first control unit when a predetermined first time passes after activation of the information processing device, the first control unit is configured to start an operation of controlling the first delay application unit in a manner as to reduce the differential signal skew detected by the first skew detection unit when the first time passage report is received, the reception circuit of the second semiconductor integrated circuit further includes a second time measurement unit, the second time measurement unit being configured to send a second time passage report to the second control unit when a predetermined second time, which is longer than the predetermined first time, passes after the activation of the information processing device, and the second control unit is configured to start an operation of controlling the second delay application unit in a manner as to reduce the differential signal skew detected by the second skew detection unit when the second time passage report is received.

10. The information processing device according to claim 9, wherein each of the first skew detection unit and the second skew detection unit is configured to detect a direction of the differential signal skew of the positive signal and the negative signal, by detecting whether a combined resistance of on-resistances of transistors determined simultaneously by voltages of the positive signal and the negative signal is higher than or lower than an on-resistance of a transistor determined by a center voltage of waveforms of the positive signal and the negative signal, when a comparative relationship, which indicates whether a voltage of the negative signal is higher than or lower than a voltage of the positive signal, is reversed.

11. The information processing device according to claim 10, wherein each of the first skew detection unit and the second skew detection unit includes a parallel circuit including a first transistor in which the positive signal is applied to a control electrode and a second transistor in which the negative signal is applied to a control electrode, and a third transistor in which the center voltage is applied to a control electrode, wherein the transmission/reception device includes a detection unit in a format of a differential amplifier including output according to a difference between a combined resistance of on-resistances of the first transistor and the second transistor determined by the respective voltages applied to the control electrodes of the first transistor and the second transistor, and an on-resistance of the third transistor determined by the voltage applied to the control electrode of the third transistor, a first clock generation unit configured to output high-level when the voltage of the negative signal is higher than the voltage of the positive signal, a second clock generation unit configured to output high-level when the voltage of the negative signal is lower than the voltage of the positive signal, a first hold unit configured to take in the output of the detection unit when the output of the first clock generation unit rises, and a first hold unit configured to take in the output of the detection unit when the output of the second clock generation unit rises.

* * * * *